United States Patent
Wakabayashi et al.

(10) Patent No.: US 8,625,645 B2
(45) Date of Patent: Jan. 7, 2014

(54) SOLID-STATE LASER APPARATUS AND LASER SYSTEM

(71) Applicant: Gigaphoton Inc., Tochigi (JP)

(72) Inventors: Osamu Wakabayashi, Kanagawa (JP); Takashi Onose, Tochigi (JP); Shinji Ito, Tochigi (JP)

(73) Assignee: Gigaphoton Inc., Tochigi (JP)

(*) Notice: Subject to any disclaimer, the term of this patent is extended or adjusted under 35 U.S.C. 154(b) by 0 days.

(21) Appl. No.: 13/671,657

(22) Filed: Nov. 8, 2012

(65) Prior Publication Data

US 2013/0064259 A1    Mar. 14, 2013

Related U.S. Application Data

(63) Continuation of application No. PCT/JP2011/061754, filed on May 23, 2011.

(30) Foreign Application Priority Data

May 24, 2010    (JP) .................................. 2010-118845

(51) Int. Cl.
     *H01S 3/13*    (2006.01)
(52) U.S. Cl.
     USPC .............. 372/29.011; 372/29.014; 372/38.01; 372/41
(58) Field of Classification Search
     USPC ................. 372/29.011, 29.014, 38.01, 41
     See application file for complete search history.

(56) References Cited

U.S. PATENT DOCUMENTS

| 5,760,408 A | 6/1998 | Kikuchi et al. | |
| 2006/0215716 A1* | 9/2006 | Luo et al. | 372/38.08 |
| 2007/0268940 A1* | 11/2007 | Luo et al. | 372/20 |
| 2008/0261382 A1* | 10/2008 | Starodoumov et al. | 438/463 |
| 2010/0002731 A1 | 1/2010 | Kimura et al. | |

FOREIGN PATENT DOCUMENTS

| JP | 11-298083 | 10/1999 |
| JP | 2002-223018 | 8/2002 |
| JP | 2002-299734 | 10/2002 |
| JP | 2003-195372 | 7/2003 |

OTHER PUBLICATIONS

International Search Report mailed on Aug. 2, 2011.

* cited by examiner

*Primary Examiner* — Kinam Park
(74) *Attorney, Agent, or Firm* — IPUSA, PLLC

(57) ABSTRACT

A solid-state laser apparatus may include: a master oscillator configured to output laser light having at least one longitudinal mode, the master oscillator being capable of changing the spectral linewidth of the laser light output therefrom; at least one amplifier located downstream of the master oscillator on an optical path; a wavelength converter located downstream of the amplifier on the optical path; a detector configured to detect the spectrum of the laser light; and a controller configured to control the spectral linewidth of the laser light output from the master oscillator based on a detection result of the detector.

21 Claims, 26 Drawing Sheets

SOLID-STATE LASER APPARATUS AND LASER SYSTEM

CROSS-REFERENCE TO RELATED APPLICATIONS

The present application is a continuation of International Application PCT/JP2011/061754, with an international filing date of May 23, 2011, which claims priority from Japanese Patent Application No. 2010-118845 filed May 24, 2010. The contents of the above applications are hereby incorporated by reference.

BACKGROUND

1. Technical Field

The present disclosure relates to a solid-state laser apparatus and a laser system.

2. Related Art

As exposure light sources for use in manufacturing of semiconductor devices, KrF excimer laser apparatuses outputting laser light in the deep ultraviolet region and ArF excimer laser apparatuses outputting laser light in the vacuum ultraviolet region have been used. In these laser apparatuses, laser light output from a master oscillator containing a gas gain medium is amplified by an amplifier also containing a gas gain medium.

SUMMARY

A solid-state laser apparatus according to one aspect of the present disclosure may include: a master oscillator configured to output laser light having at least one longitudinal mode, the master oscillator being capable of changing the spectral linewidth of the laser light output therefrom; an amplifier located downstream of the master oscillator on an optical path; a wavelength converter located downstream of the amplifier on the optical path; a detector configured to detect the spectrum of the laser light; and a controller configured to control the spectral linewidth of the laser light output from the master oscillator based on a detection result of the detector.

A laser system according to another aspect of the present disclosure may include: the solid-state laser apparatus described above and an amplifying apparatus located downstream of the solid-state laser apparatus on an optical path.

BRIEF DESCRIPTION OF DRAWINGS

Embodiments of the present disclosure are illustrated by way of example with reference to the accompanying drawings in which.

DETAILED DESCRIPTION

Embodiments to put the present disclosure into practice will be described in detail with reference to the accompanying drawings to give some examples. The embodiments described below are for illustrative purposes only, and are in no way intended to unduly limit what is described in the present disclosure. In addition, not all the components or operations described in the embodiments are indispensable to put the present disclosure into practice. It should be noted that the same numerals refer to the same components and redundant descriptions will be omitted. Along the description below, the views and charts schematically illustrate shapes, sizes, and positional relationships to an extent that a skilled person can understand what is described in the present disclosure, and the disclosure is not limited to the shapes, sizes, and positional relationships presented in the views and charts.

In some views, part of the hatched areas in cross section is omitted for simplified illustration. In addition, numerical values mentioned below are mere preferable examples of the present disclosure, and the disclosure is not limited to these numerical values. While a master oscillator/power oscillator (MOPO) is described as an example in the description below, the present disclosure is not limited to this and is also applicable to a master oscillator/power amplifier (MOPA).

A solid-state laser apparatus and a laser system in the embodiments of the present disclosure will be described in detail with reference to the accompanying drawings. The description will be given in the order below.

Figure 1:
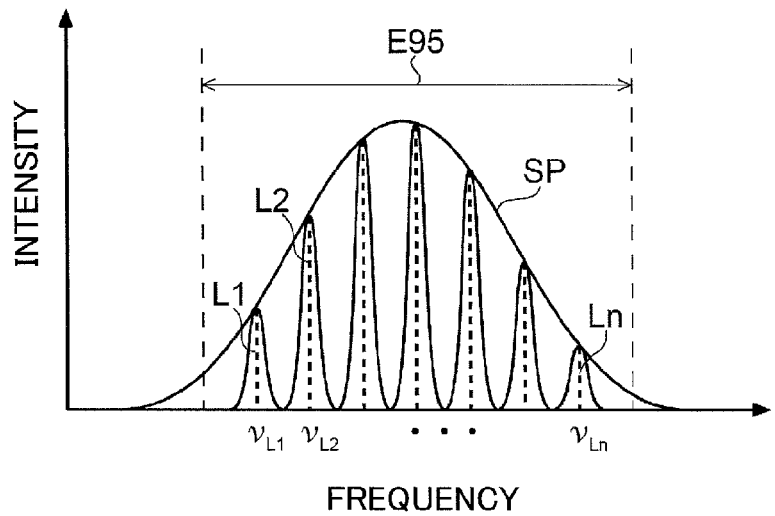
FIG. 1 is a schematic view illustrating an overview of embodiments of the present disclosure.

Table of Contents
1. Overview
2. Definition of Terms
3. Laser System: First Embodiment
3.1 Solid-State Laser Apparatus Feedback-Controlling Spectral Linewidth
3.1.1 Master Oscillator
3.1.1.1 Master Oscillator Having Littman Cavity
3.1.1.2 Master Oscillator Including Wavelength Filter: First Modification
3.1.1.3 Master Oscillator Including Line Narrowing Module: Second Modification
3.1.1.3.1 Line Narrowing Module Using Beam Expander and Grating
3.1.1.4 Master Oscillator Including Seed Laser: Third Modification
3.1.1.4.1 Optical Path Adjuster Using a Plurality of Mirrors
3.1.1.4.2 Optical Path Adjuster Using Grating
3.1.1.5 Master Oscillator Including Optical Modulator: Fourth Modification
3.1.1.5.1 Optical Modulator Using Electro-Optic Element
3.1.1.5.2 Optical Modulator Using Optoacoustic Elements
3.1.2 Amplifier
3.1.2.1 Fabry-Perot Power Oscillator
3.1.2.2 Ring Power Oscillator: First Modification
3.1.2.3 Regenerative Amplifier: Second Modification
3.1.2.4 Multipath Power Amplifier: Third Modification
3.1.3 Wavelength Converter
3.1.3.1 Wavelength Converter Using BBO Crystal and KBBF Crystal
3.1.4 Detector
3.1.4.1 Detector Using Monitor Etalon
3.1.4.2 Detector Using Czerny-Turner Spectroscope
3.1.5 Controller
3.2 Amplifying Apparatus
3.2.1 Power Oscillator
4. Laser System Feedback-Controlling Total Spectral Linewidth: Second Embodiment
5. Modifications of Solid-State Laser Apparatus
5.1 Solid-State Laser Apparatus Including Coherence Reduction Module: First Modification
5.1.1 Coherence Reduction Module Using Optical Pulse Stretch
5.2 Solid-State Laser Apparatus Including Wavelength Converter Using LBO Crystal and THG Crystal: Second Modification
6. Laser System Using Power Amplifier as Amplifying Apparatus: Third Embodiment 1. Overview An overview of embodiments described below will be given first. FIG. 1 is a schematic view illustrating an overview of the embodiments described below.

Light sources for exposure apparatuses for use in manufacturing of semiconductors and liquid crystal panels, for example, may preferably have characteristics capable of suppressing speckle while suppressing chromatic aberration. For this purpose, the spectrum SP of laser light output from a light source preferably has an appropriate spread in a comparatively narrow band as illustrated in FIG. 1, for example. The spectral purity E95 illustrated in FIG. 1 may be a linewidth in a frequency range or wavelength band in which 95% of the optical energy in the spectrum is concentrated.

The spectrum SP may be approximately achieved using a plurality of longitudinal modes L1, L2, . . . , Ln, for example. In this case, the intensity of each of the longitudinal modes L1, L2, . . . , Ln may be increased or decreased in accordance with the form of the spectrum SP as illustrated in FIG. 1.

It should be noted that a master oscillator serving as a seed light source for use in a laser system is not always capable of outputting laser light whose spectrum SP has an appropriate spread in a comparatively narrow band.

Accordingly, the spectrum SP of laser light required by an exposure apparatus or other external apparatuses may be approximately achieved in the embodiments described below using laser light having a plurality of longitudinal modes L1, L2, . . . , Ln as illustrated in FIG. 1. In this case, the center frequency of each of the longitudinal modes L1 to Ln, the frequency difference (hereinafter referred to as longitudinal mode spacing) between adjacent longitudinal modes L1 to Ln, and the light intensity of each of the longitudinal modes L1 to Ln may be adjusted based on the form of the spectrum SP. In this manner, laser light having a spectral form capable of suppressing speckle while suppressing chromatic aberration can be achieved. While a Gaussian distribution is adopted as the form of the spectrum SP in FIG. 1, such a distribution is not a limiting example. Various other forms of spectrum are applicable, such as a top-hat form having a broad peak around the center frequency, a multi-peak form, and an unsymmetrical form. In other words, the embodiments described below are applicable to various forms of spectrum that could be required.

2. Definition of Terms

The multi-longitudinal mode means that the light has a plurality of longitudinal modes. The spectral linewidth of laser light having a plurality of longitudinal modes means the linewidth of the total spectrum of the laser light having a plurality of longitudinal modes. Laser light may be pulsed laser light or continuous laser light. An amplifier and amplifying apparatus may include a power oscillator, a power amplifier, and a regenerative amplifier. The power oscillator may include a gain medium for amplifying laser light and an optical resonator. The power amplifier may include a gain medium for amplifying laser light and at least one optical element forming a path that passes through the gain medium. A master oscillator may include a laser for outputting laser light in multi-longitudinal mode and a laser oscillator, for example.

3. Laser System

First Embodiment

A laser system 1 in a first embodiment of the present disclosure will be described with reference to some drawings. While an ArF laser outputting laser light with a central wavelength of 193 nm is used as an example of the laser system 1 in the first embodiment, this is not a limiting example. Various types of laser systems including KrF lasers, XeCl lasers, XeF lasers, and other excimer lasers are also applicable to the laser system 1.

Figure 2:
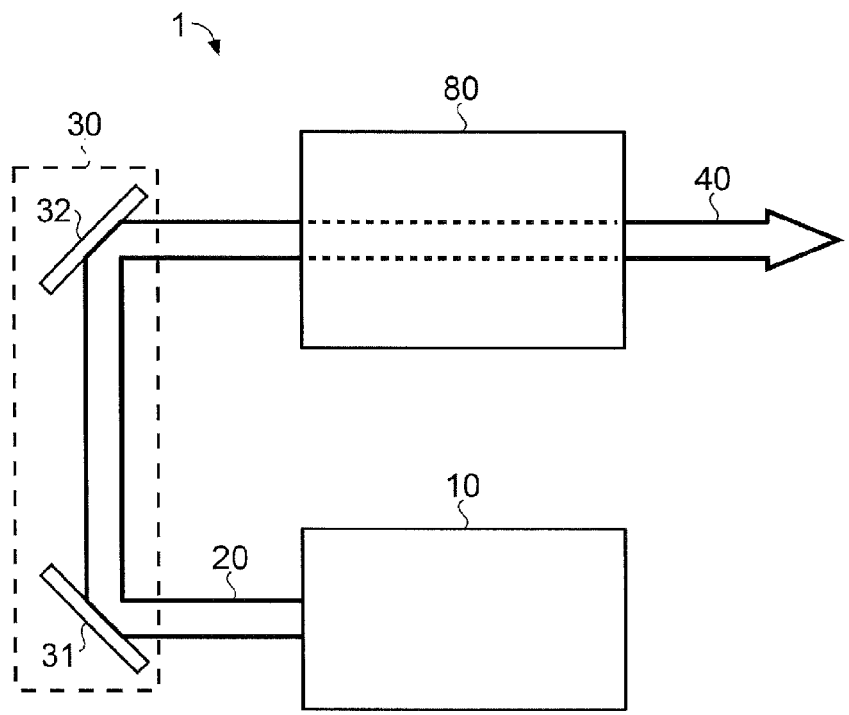
FIG. 2 is a schematic view illustrating the configuration of a laser system in a first embodiment of the present disclosure.

FIG. 2 schematically illustrates the configuration of the laser system 1 in the first embodiment. The laser system 1 may include a solid-state laser apparatus 10 and an amplifying apparatus 80 as illustrated in FIG. 2. The solid-state laser apparatus 10 may emit laser light 20 having a plurality of longitudinal modes for approximately achieving the spectrum SP. The laser light 20 output from the solid-state laser apparatus 10 may be guided by an optical system 30 to the amplifying apparatus 80. The optical system 30 may include a plurality of highly reflective mirrors 31 and 32 highly reflecting the laser light 20. The amplifying apparatus 80 may amplify the incident laser light 20 and output the amplified light as laser light 40. The output laser light 40 may be input to an exposure apparatus, for example.

3.1 Solid-State Laser Apparatus Feedback-Controlling Spectral Linewidth

Figure 3:
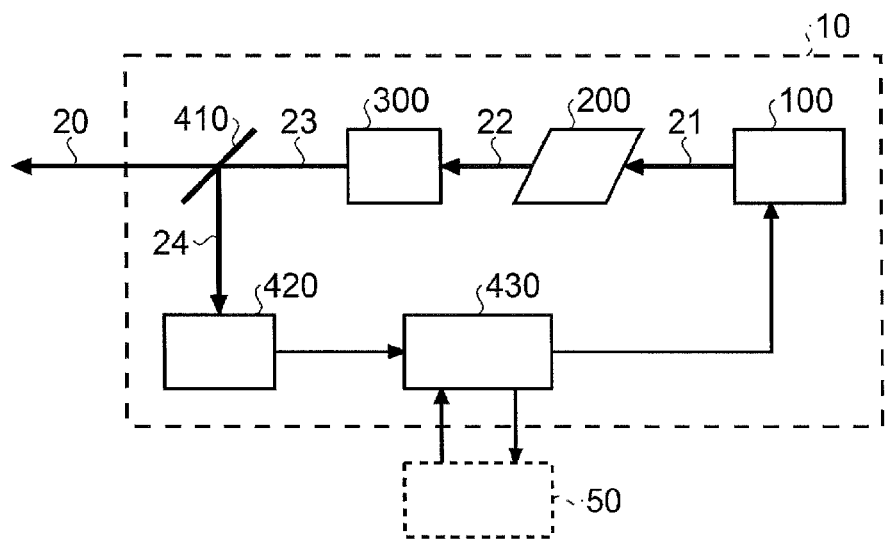
FIG. 3 is a schematic view illustrating the configuration of a solid-state laser apparatus in the first embodiment.

The solid-state laser apparatus 10 illustrated in FIG. 2 will be described in greater detail with reference to FIG. 3. FIG. 3 schematically illustrates the configuration of the solid-state laser apparatus 10. The solid-state laser apparatus 10 may include a master oscillator 100, an amplifier 200, and a wavelength converter 300 as illustrated in FIG. 3. The master oscillator 100 may be a so-called seed light source. The master oscillator 100 may output laser light having at least one longitudinal mode as laser light 21. If the laser light 21 has a plurality of longitudinal modes, the curve connecting the light intensity peaks of the longitudinal modes of the laser light 21 may approximate the spectrum SP. The amplifier 200 may amplify the laser light 21 and output the amplified light as laser light 22. The wavelength converter 300 may convert the wavelength of the laser light 22 in such a manner that the wavelength of the laser light 21 output from the master oscillator 100 (or the laser light 22 after being amplified by the amplifier 200) is converted to match the wavelength range that can be amplified by the amplifying apparatus 80 serving as an amplifier stage. For example, the wavelength converter 300 may generate the fourth harmonic light of each longitudinal mode of the laser light 22 as a fundamental wave. The wavelength converter 300 may output the fourth harmonic light thus generated as laser light 23.

The solid-state laser apparatus 10 may also include a beam splitter 410, a detector 420, and a controller 430. The beam splitter 410 may be arranged on the optical path of the laser light 23 output from the wavelength converter 300. The beam splitter 410 may split the optical path of the laser light 23 into two. The beam splitter 410 may be coated with a film that partially reflects the laser light 23. The laser light 23 having passed through the beam splitter 410 may be output as the laser light 20 from the solid-state laser apparatus 10. The laser light 23 having been reflected by the beam splitter 410 may enter the detector 420 as laser light 24.

The detector 420 may detect the total spectral linewidth of the laser light 24. The controller 430 may feedback-control the master oscillator 100 based on the detected spectral linewidth. In this case, the controller 430 may control the center frequency, the longitudinal mode spacing, and the light intensity of each of the longitudinal modes L1 to Ln of the laser light 21 output from the master oscillator 100. The controller 430 may also feedback-control the master oscillator 100 in accordance with a command from an external apparatus 50, such as an exposure apparatus controller.

3.1.1 Master Oscillator

Specific examples of the master oscillator 100 included in the solid-state laser apparatus 10 illustrated in FIG. 3 will be described.

3.1.1.1 Master Oscillator Having Littman Cavity

Figure 4:
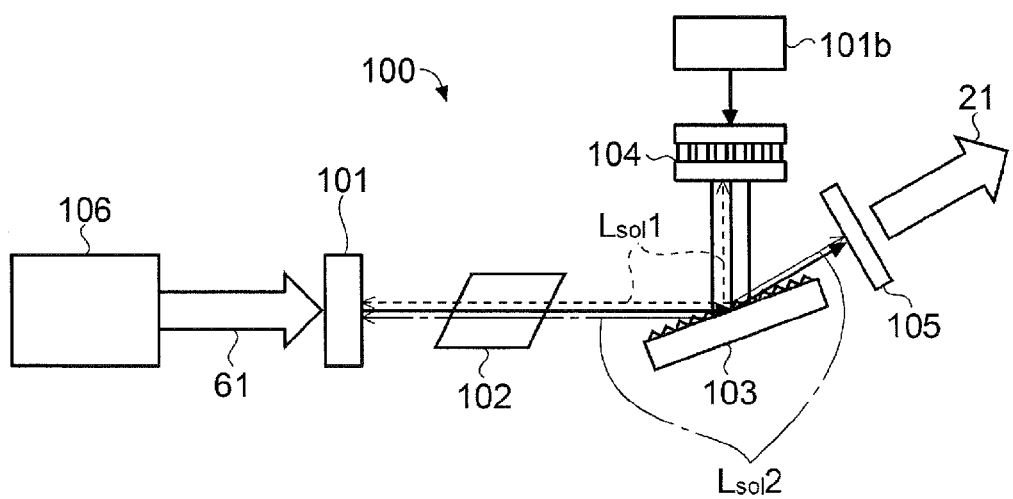
FIG. 4 is a schematic view illustrating the configuration of a master oscillator having a Littman cavity in the first embodiment.

The master oscillator 100 having a Littman cavity will be described first. FIG. 4 schematically illustrates the configuration of the master oscillator 100 having a Littman cavity. The master oscillator 100 may include a highly reflective mirror 101, a Ti:sapphire crystal 102 as a gain medium, a grating 103, a highly reflective mirror 104, an output coupler 105, and a pumping laser 106 as illustrated in FIG. 4. The highly reflective mirror 101 and the output coupler 105 may constitute an optical resonator. The Ti:sapphire crystal 102 and the grating 103 may be arranged on the optical path in the optical resonator constituted by the highly reflective mirror 101 and the output coupler 105. The highly reflective mirror 104 may reflect the laser light diffracted by the grating 103 back to the grating 103. The highly reflective mirror 104 may be a deformable mirror with a reflecting surface whose curvature can be changed with respect to the diffusion directions of the grating 103. With this configuration, the highly reflective mirrors 101 and 104 may constitute another optical resonator, which is different from the optical resonator constituted by the highly reflective mirror 101 and the output coupler 105. It should be noted that a resonator length $L_{sol}1$ from the highly reflective mirror 101 to the highly reflective mirror 104 may be equal to a resonator length $L_{sol}2$ from the highly reflective mirror 101 to the output coupler 105.

The inner surface of the highly reflective mirror 101 constituting the optical resonators may be coated with a film that highly reflects light with wavelengths of approximately 773.6 nm and highly transmits excitation light 61 from the pumping laser 106. The opposite surface of the highly reflective mirror 101 may be coated with a film that highly transmits excitation light 61. In this manner, the highly reflective mirror 101 can introduce the excitation light 61 from the pumping laser 106 into the optical resonators and reflect the laser light from the Ti:sapphire crystal 102.

The excitation light 61 having entered the optical resonators through the highly reflective mirror 101 may enter the Ti:sapphire crystal 102. The light incident/output end surfaces of the Ti:sapphire crystal 102 may be Brewster-cut. The Brewster-cut end surfaces can suppress reflection of laser light, thereby improving amplifying efficiency. In addition, Brewster cut can specify the polarization state of laser light. Accordingly, the excitation light 61 and the laser light can enter the Ti:sapphire crystal 102 at higher efficiency.

The incident excitation light 61 may result in laser light outputting from the Ti:sapphire crystal 102. The laser light emitted from the Ti:sapphire crystal 102 may reciprocate in the optical resonator constituted by the highly reflective mirror 101, the grating 103, and the highly reflective mirror 104 and the optical resonator constituted by the highly reflective mirror 101, the grating 103, and the output coupler 105. As a result, the laser light passing through the Ti:sapphire crystal 102 may be amplified. The laser light having passed through the Ti:sapphire crystal 102 may be diffracted by the grating 103.

The inner surface of the output coupler 105 constituting the optical resonator may be coated with a film that partially reflects light with wavelengths of approximately 773.6 nm. The opposite surface of the output coupler 105 may be coated with an antireflection film. In this manner, the output coupler 105 can function as a light output end for outputting the laser light 21.

The output coupler 105 may be arranged in the output direction of a zero-order diffracted ray, for example, with respect to the grating 103. The highly reflective mirror 104 may be arranged in the output directions of ±mth-order diffracted rays with respect to the grating 103. With this configuration, the spectral linewidth of the laser light can be adjusted by adjusting the number of grooves per unit length on the grating 103. In addition, the wavelength of the laser light 21 output from the master oscillator 100 can be selected by adjusting the angle of the highly reflective mirror 104 with respect to the grating 103.

The number of longitudinal modes of the laser light 21 output from the master oscillator 100 can be determined by the spectral linewidth and longitudinal mode spacing. In this regard, the number of grooves per unit length on the grating 103 should be designed in such a manner that the total spectral linewidth of the laser light 21 will be the spectral linewidth of the desired spectrum SP. In addition, the resonator lengths $L_{sol}1$ and $L_{sol}2$ in the master oscillator 100 should be designed so as to achieve a certain longitudinal mode spacing. In this manner, the laser light 21 with a desired number of longitudinal modes and a desired spectral linewidth can be produced.

A preferable resonator length $L_{sol}$ in the master oscillator 100 when the laser system 1 is employed as the light source for semiconductor exposure will now be described. The longitudinal mode spacing of the laser light 40 output from the laser system 1 can be represented as $C/2L_{EXC}$, where C is the speed of light, and $L_{EXC}$ is the resonator length in the master oscillator 100 for producing the laser light 21 having a plurality of longitudinal modes whose peaks are distributed to trace the form of the spectrum SP suitable for semiconductor exposure, for example.

To distribute the peaks of the longitudinal modes L1 to Ln so as to trace the form of the desired spectrum SP as illustrated in FIG. 1, the longitudinal mode spacing $\Delta v$ ($=|v_{L1}-v_{L2}|=\ldots=|v_{Ln-1}-v_{Ln}|$) of the laser light 40 may be set to $C/2L_{EXC}$ or less ($v \leq C/2L_{EXC}$).

The longitudinal mode spacing $\Delta v$ of the laser light 21 output from the master oscillator 100 can be represented as $C/2L_{sol}$. To achieve a desired longitudinal mode spacing with the master oscillator 100, the resonator length $L_{sol}$ in the master oscillator 100 may preferably satisfy $L_{sol} \geq L_{EXC}$. For example, if the longitudinal mode spacing $\Delta v$ of the laser light 21 is 150 MHz, the resonator length $L_{sol}$ in the master oscillator 100 may preferably be 1.00 m.

In this case, the resonator length $L_{sol}$ in the master oscillator 100 may range between 0.5 m and 1.5 m inclusive, for example. More preferably, the resonator length $L_{sol}$ may range between 0.8 m and 1.2 m inclusive, for example. The lower limit of the resonator length $L_{sol}$ may be determined based on a requirement of an exposure apparatus, for example. The upper limit of the resonator length $L_{sol}$ may be determined for ease of design, for example.

The master oscillator 100 may include a driving mechanism for changing the reflecting surface of the highly reflective mirror 104, which is a deformable mirror, for changing the wave front in the optical resonator. This driving mechanism may include a driver 101b for changing the curvature of the surface of the highly reflective mirror 104. The controller 403 may control the curvature of the reflecting surface of the highly reflective mirror 104 through the driver 101b. By changing the wave front in the optical resonator, the curvature of the wave front of the laser light incident on the grating 103 can be changed. The wavelength band selected by the grating can be thus changed. Accordingly, the total spectral linewidth of the laser light 21 output from the master oscillator 100 can be controlled. While the wave front in the optical resonator is changed by the highly reflective mirror 104 in this embodiment, this is not a limiting example. Alternatively, the curvature of the reflecting surface of the grating 103, the highly reflective mirror 101 or the output coupler 105 may be changed.

3.1.1.2 Master Oscillator Including Wavelength Filter: First Modification

Figure 5:
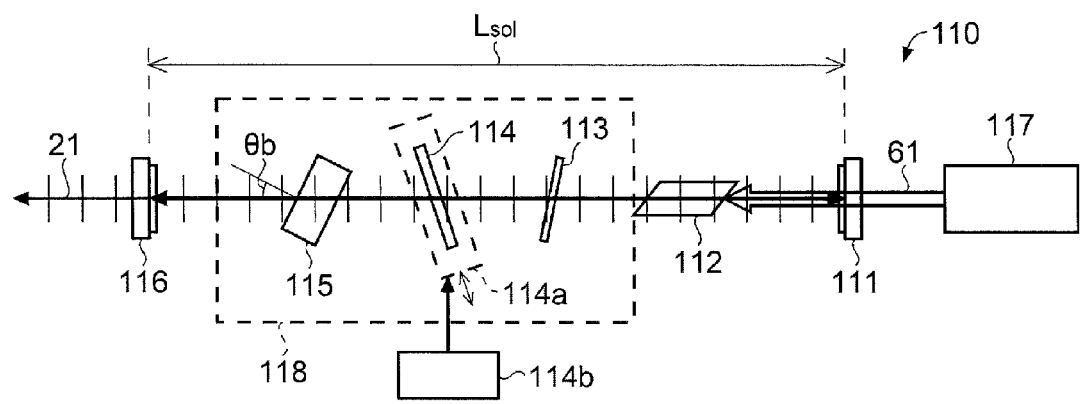
FIG. 5 is a schematic view illustrating the configuration of a master oscillator including a wavelength filter in the first embodiment.

A first modification of the master oscillator will now be described in detail with reference to FIG. 5. FIG. 5 schematically illustrates the configuration of a master oscillator 110 including a wavelength filter. The master oscillator 110 may include a highly reflective mirror 111, a Ti:sapphire crystal 112 as a gain medium, a coarse etalon 113, a fine etalon 114, a birefringent filter 115, an output coupler 116, and a pumping laser 117 as illustrated in FIG. 5. The highly reflective mirror 111 and the output coupler 116 may constitute an optical resonator. The Ti:sapphire crystal 112, the coarse etalon 113, the fine etalon 114, and the birefringent filter 115 may be arranged on the optical path in the optical resonator constituted by the highly reflective mirror 111 and the output coupler 116. The coarse etalon 113, the fine etalon 114, and the birefringent filter 115 may constitute a line narrowing module 118.

The inner surface of the highly reflective mirror 111 constituting the optical resonator may be coated with a film that highly reflects light with wavelengths of approximately 773.6 nm and highly transmits the excitation light 61 coming from the pumping laser 117. The opposite surface of the highly reflective mirror 111 may be coated with a film that highly transmits the excitation light 61. In this manner, the highly reflective mirror 111 can introduce the excitation light 61 from the pumping laser 117 into the optical resonator and reflect the laser light from the Ti:sapphire crystal 112 back in the optical resonator.

The excitation light 61 having entered the optical resonator through the highly reflective mirror 111 may enter the Ti:sapphire crystal 112. The light incident/output end surfaces of the Ti:sapphire crystal 112 may be Brewster-cut. The Ti:sapphire crystal 112 excited by the excitation light 61 may emit laser light. The laser light may reciprocate in the optical resonator constituted by the highly reflective mirror 111 and the output coupler 116. As a result, the laser light passing through the Ti:sapphire crystal 112 may be amplified.

The inner surface of the output coupler 116 constituting the optical resonator may be coated with a film that partially reflects light with wavelengths of approximately 773.6 nm. The opposite surface of the output coupler 116 may be coated with an antireflection film. In this manner, the output coupler 116 can function as a light output end for outputting the laser light 21.

Figure 6:
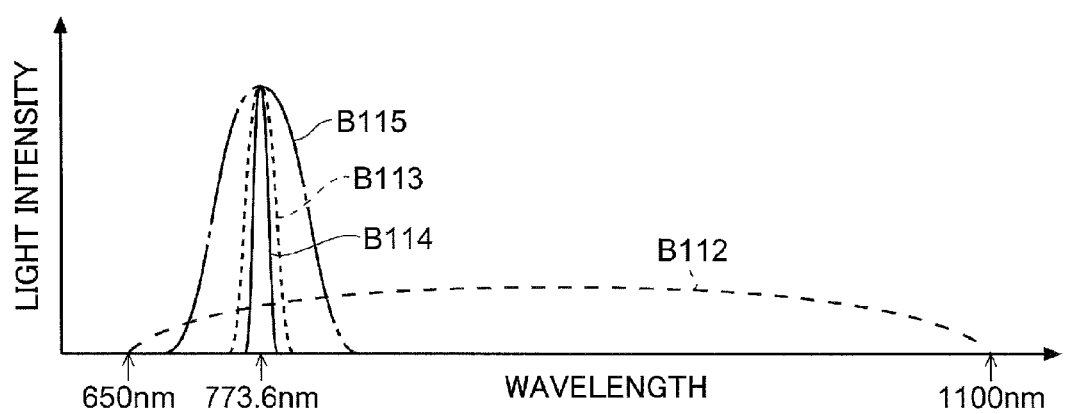
FIG. 6 is a chart illustrating the wavelength spectrum of laser light oscillated by a Ti:sapphire crystal and wavelength selection characteristics of a birefringent filter, a coarse etalon, and a fine etalon in the first embodiment.
Figure 7:
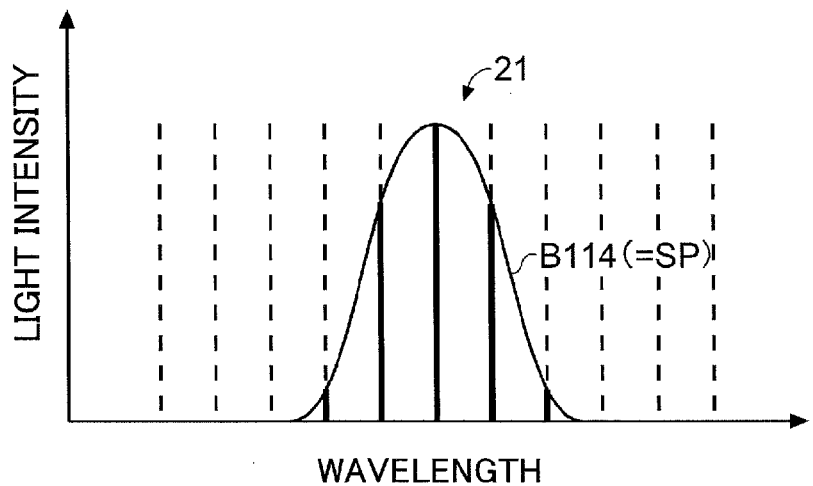
FIG. 7 is a chart illustrating the wavelength selection characteristic of the fine etalon and the longitudinal modes of laser light in the first embodiment.

The birefringent filter 115, the coarse etalon 113, and the fine etalon 114 arranged in the optical resonator may function as wavelength filters. FIG. 6 illustrates the wavelength spectrum of the laser light emitted by the Ti:sapphire crystal 112 and wavelength selection characteristics of the birefringent filter 115, and the coarse etalon 113, and the fine etalon 114. FIG. 7 illustrates the wavelength selection characteristic of the fine etalon 114 and the longitudinal modes of the laser light 21.

As illustrated in FIG. 6, the Ti:sapphire crystal 112 excited by the excitation light 61 can output laser light having spectrum B112 in which longitudinal modes are distributed in a comparatively wide wavelength range from about 650 nm to 1100 nm. By contrast, the light transmission spectrum B114 of the fine etalon 114 is narrower than the spectrum B112 of the laser light. The light transmission spectrum B114 may be substantially equal to the desired spectrum SP (refer to FIG. 1). Using the fine etalon 114 as a wavelength filter, therefore, can convert the total spectrum of the laser light 21 output from the master oscillator 110 substantially into the desired spectrum SP as illustrated in FIG. 7.

It should be noted that the light transmission band (light transmission spectrum B114) of the fine etalon 114 is not limited to one band. Similarly, each of the light transmission band of the birefringent filter 115 and the coarse etalon 113 is not limited to one band. In consideration of this, one desired light transmission band (light transmission spectrum B114) may be selected from a plurality of light transmission bands of the fine etalon 114 by using the combination of the birefringent filter 115, the coarse etalon 113, and the fine etalon 114. A light transmission spectrum having the same form as that of the spectrum SP can be thus achieved.

The birefringent filter 115 may be arranged in a tilted position such that the incident angle of laser light will be a Brewster angle with respect to the optical path in the optical resonator. The two light incident/output surfaces of the birefringent filter 115 may each be coated with an antireflection film. The birefringent filter 115 along the optical path may be of such a thickness as to function as a wave plate with respect to light with a wavelength of 773.6 nm, for example.

The reflecting surface spacing and reflectance of the coarse etalon 113 may be specified in such a manner that the light transmission spectrum B113 of the coarse etalon 113 will be narrower than the light transmission spectrum B115 of the birefringent filter 115. The number of longitudinal modes of the light having passed through the birefringent filter 115 can be, therefore, narrowed down by the coarse etalon 113. The coarse etalon 113 may be a solid etalon prepared by applying a film having a certain reflectance to both surfaces of a certain substrate that transmits relevant laser wavelengths. Alternatively, the coarse etalon 113 may be an air-gap etalon prepared by arranging two mirrors having a certain partial reflectance with a spacer interposed therebetween to maintain a certain mirror spacing.

The reflecting surface spacing and reflectance of the fine etalon 114 may be specified in such a manner that the light transmission spectrum B114 of the fine etalon 114 will be narrower than the light transmission spectrum B113 of the coarse etalon 113. At least one of the light incident/output surfaces of the fine etalon 114 may be coated with a film in such a manner that the light transmission spectrum B114 of the fine etalon 114 will be narrower than the light transmission spectrum B113 of the coarse etalon 113. The number of longitudinal modes of the light having passed through the coarse etalon 113 can be, therefore, further narrowed down by the fine etalon 114. The fine etalon may be either a solid or air-gap etalon.

With this configuration, the pulsed excitation light 61 output from the pumping laser 117 may pass through the highly reflective mirror 111 and enter the Ti:sapphire crystal 112, thereby exciting the Ti:sapphire crystal 112. The Ti:sapphire crystal 112 can emit light when it transits from the excited state to the ground state. This light has a comparatively wide spectral linewidth. The linewidth of the laser light in the optical resonator may be narrowed down using the coarse etalon 113, the fine etalon 114, and the birefringent filter 115. The laser light whose linewidth has been narrowed down may be incident on the output coupler 116. The output coupler 116 may output part of the laser light as the laser light 21 from the optical resonator. The output coupler 116 may also reflect another part of the laser light back in the optical resonator. The linewidth of the reflected laser light may be further narrowed down upon passing through the birefringent filter 115, the fine etalon 114, and the coarse etalon 113. The laser light whose linewidth has been narrowed down may be then amplified upon passing through the Ti:sapphire crystal 112. The amplified laser light may be reflected by the highly reflective mirror 111 and further amplified upon passing through the Ti:sapphire crystal 112 again. The linewidth of the amplified laser light may be narrowed down upon passing through the coarse etalon 113, the fine etalon 114, and the birefringent filter 115 again. The laser light whose linewidth has been narrowed down may be incident on the output coupler 116. The output coupler 116 may output part of the laser light as the laser light 21 from the optical resonator and reflect another part of the laser light back in the optical resonator. Through repetitions of such a series of operations, laser oscillation occurs in the master oscillator 110, which can thus output the laser light with a spectrum having desired longitudinal modes.

Figure 8:
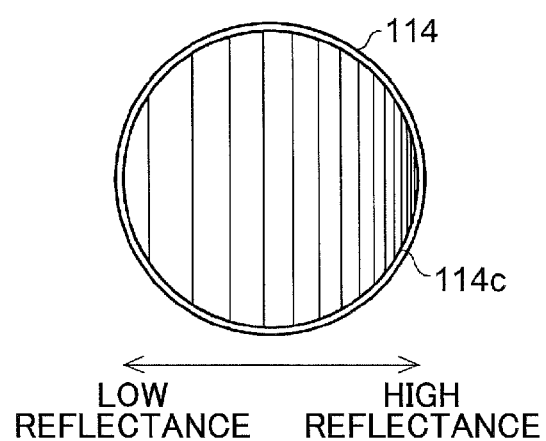
FIG. 8 is a schematic view illustrating the configuration of the fine etalon in FIG. 5.
Figure 9:
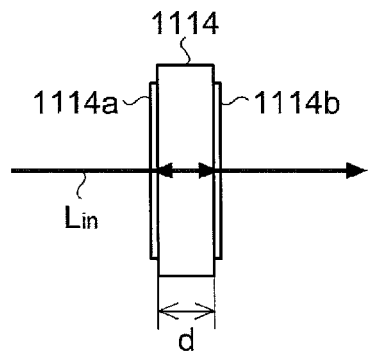
FIG. 9 is a schematic view illustrating an example of the etalon.
Figure 10:
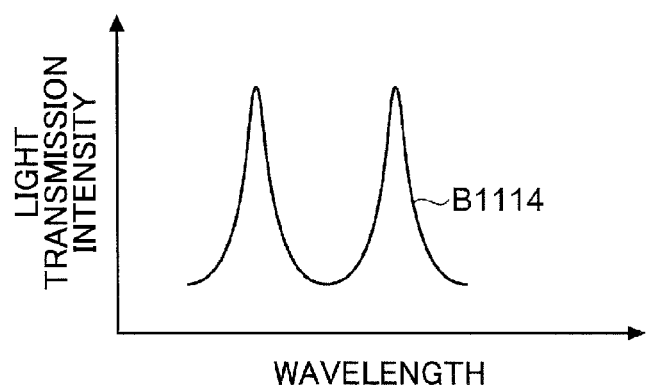
FIG. 10 is a chart illustrating the relationship between the free spectral range (FSR) and full width at half maximum (FWHM) of the etalon in FIG. 9.
Figure 11:
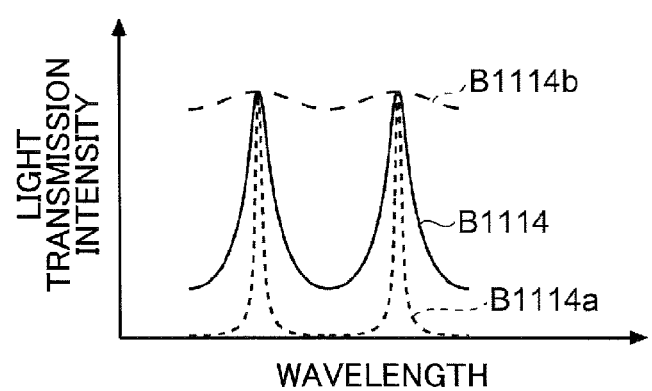
FIG. 11 is a chart illustrating the finesse characteristics by the reflectance of the etalon in FIG. 9.

Both light incident/output surfaces of the fine etalon 114 may be coated in such a manner that the reflectance of the surfaces varies depending on the position through which laser light passes. It should be noted that the reflectance of the light incident and output surfaces of the etalon for a given laser beam passing through the etalon may be the same. For example, both light incident/output surfaces of the fine etalon 114 may be coated with a partially reflective film 114c that causes the reflectance of the surfaces to gradually vary in the same or similar manner depending on the position through which laser light passes as illustrated in FIG. 8. The relationship between the reflectance of the etalon and finesse characteristics will now be described. FIG. 9 is a sectional view illustrating an example of the etalon. FIG. 10 illustrates the relationship between the free spectral range (FSR) and full width at half maximum (FWHM) of the etalon in FIG. 9. FIG. 11 illustrates the finesse characteristics for each reflectance of the etalon in FIG. 9.

This fine etalon 1114 illustrated in FIG. 9 may be a Fabry-Perot etalon, for example. The light incident/output surfaces of the etalon 1114 may be coated with respective partially reflective films 1114a and 1114b. The etalon 1114 can provide the function of a wavelength filter for enhancing a specific wavelength because of the interference effect between the opposing reflecting surfaces (light incident/output surfaces). This characteristic of the etalon 1114 can be typically specified by FSR and F (finesse). F can be represented by the ratio of FSR to FWHM. F can be, therefore, determined primarily by the reflectance. Supposing that the substrate thickness of the etalon 1114 is d, the refractive index of the substrate is n, and the reflectance of the partially reflective films 1114a and 1114b is R, Formulas (1) to (3) below are satisfied, where $\lambda$ is the wavelength of laser light $L_{in}$.

$$F = \pi R^{1/2}/(1-R) \quad (1)$$

$$FSR = \lambda 2/(2nd) \quad (2)$$

$$FWHM = FSR/F \quad (3)$$

Based on Formulas (1) to (3), light transmission spectrum B1114 of the etalon 1114 can be in the form having a peak for each FSR as illustrated in FIG. 10. Raising the reflectance R of the partially reflective films 1114a and 1114b as in FIG. 11 can provide the etalon 1114 with a light transmission spectrum B1114a in the form of repeated steep peaks. By contrast, lowering the reflectance of the partially reflective films 1114a and 1114b can result in a light transmission spectrum B1114b in a comparatively broad form. In this example, the light transmission spectrum B1114 results from a reflectance R of 50%, the light transmission spectrum B1114a results from a reflectance R of 90%, and the light transmission spectrum B1114b results from a reflectance R of 4%.

The fine etalon 114 coated with the partially reflective film 114c causing the reflectance to gradually vary depending on the position as illustrated in FIG. 8 may be moved in the direction in which the reflectance of the portion arranged in the optical path varies. By moving the fine etalon 114 in the direction in which the reflectance varies, the linewidth of the light transmission spectrum B114 of the fine etalon 114 can be controlled. As a result, the total spectral linewidth of the laser light 21 output from the master oscillator 110 can be controlled.

The master oscillator 110, therefore, may include a driving mechanism capable of moving the fine etalon 114 as illustrated in FIG. 5. The driving mechanism may move the fine etalon 114 in the direction in which the reflectance of the portion of the fine etalon 114 arranged in the optical path varies. The driving mechanism may include a moving stage 114a and a driver 114b. The moving stage 114a may hold the fine etalon 114. The driver 114b may drive the moving stage 114a to move in the direction in which the reflectance of the portion of the fine etalon 114 arranged in the optical path varies. The fine etalon 114 may be fixed to the moving stage 114a so that the reflectance gradually varies along the moving direction of the moving stage 114a. By moving the fine etalon 114, another portion of the fine etalon 114 that has a different reflectance from that of the portion arranged in the optical path before being moved may be arranged in the optical path. If the master oscillator 110 is employed in place of the master oscillator 100 in the solid-state laser apparatus 10, the controller 430 may control the moving stage 114a through the driver 114b. The controller 430 can thus control the spectral linewidth of the laser light produced by the solid-state laser apparatus 10.

With the configuration illustrated in FIG. 5, the longitudinal mode spacing of the laser light 21 can be adjusted by adjusting the resonator length $L_{sol}$ of the optical resonator constituted by the highly reflective mirror 111 and the output coupler 116. Furthermore, the linewidth of the laser light 21 can be adjusted by moving the fine etalon 114 and adjusting the reflectance of the part of the etalon through which the laser light passes.

3.1.1.3 Master Oscillator Including Line Narrowing Module: Second Modification

Figure 12:
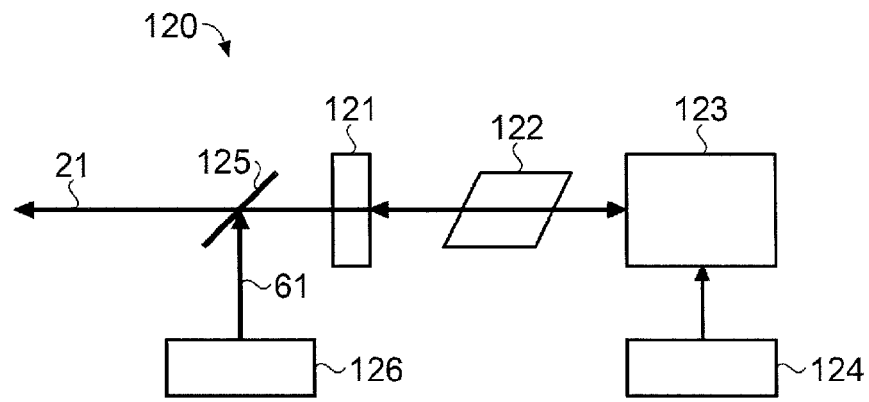
FIG. 12 is a schematic view illustrating the configuration of a master oscillator including a line narrowing element in the first embodiment.

A second modification of the master oscillator will now be described in detail with reference to FIG. 12. FIG. 12 schematically illustrates the configuration of a master oscillator 120 including a line narrowing element. The master oscillator 120 may include an output coupler 121, a Ti:sapphire crystal 122 as a gain medium, a line narrowing module 123, a beam splitter 125, and a pumping laser 126 as illustrated in FIG. 12. The line narrowing module 123 may function as a rear mirror of an optical resonator. In this case, the output coupler 121 and the line narrowing module 123 may constitute this optical resonator. Alternatively, the master oscillator 120 may include another rear mirror of an optical resonator, separate from the line narrowing module 123. The Ti:sapphire crystal 122 may be arranged on the optical path in the optical resonator constituted by the output coupler 121 and the line narrowing module 123.

The inner surface of the output coupler 121 constituting the optical resonator may be coated with a film that partially reflects light with wavelengths of approximately 773.6 nm and highly transmits the excitation light 61 from the pumping laser 126. The opposite surface of the output coupler 121 may be coated with a film that highly transmits the excitation light 61. In this manner, the output coupler 121 can function as alight output end for outputting the laser light 21 and introduce the excitation light from the pumping laser 126 into the optical resonator.

The beam splitter 125 may be arranged on the optical path of the laser light 21 output through the output coupler 121. The surface of the beam splitter 125 that faces the optical resonator may be coated with a film that highly reflects the excitation light 61 from the pumping laser 126 and highly transmits light with wavelengths of approximately 773.6 nm. The opposite surface of the beam splitter 125 may be coated with a film that highly transmits the light (laser light 21) with wavelengths of approximately 773.6 nm. In this manner, the beam splitter 125 can reflect the excitation light 61 from the pumping laser 126 toward the output coupler 121 and output the laser light 21 output through the output coupler 121 out of the master oscillator 120.

The excitation light 61 entering the optical resonator through the output coupler 121 may enter the Ti:sapphire crystal 122. The light incident/output end surfaces of the Ti:sapphire crystal 122 may be Brewster-cut. As the excitation light 61 enters the Ti:sapphire crystal 122, laser light may be output therefrom. The laser light emitted from the Ti:sapphire crystal 122 may reciprocate in the optical resonator constituted by the output coupler 121 and the line narrowing module 123. As a result, the laser light passing through the Ti:sapphire crystal 122 may be amplified.

The line narrowing module 123 may adjust the total spectral linewidth of the laser light in the optical resonator. The master oscillator 120 may, therefore, include a driver 124 capable of changing the spectral linewidth obtained by the line narrowing module 123. If the master oscillator 120 is employed in place of the master oscillator 100 in the solid-state laser apparatus 10, the controller 430 may control the line narrowing module 123 through the driver 124. The controller 430 can thus control the spectral linewidth of the laser light produced by the solid-state laser apparatus 10.

3.1.1.3.1 Line Narrowing Module Using Beam Expander and Grating

Figure 13:
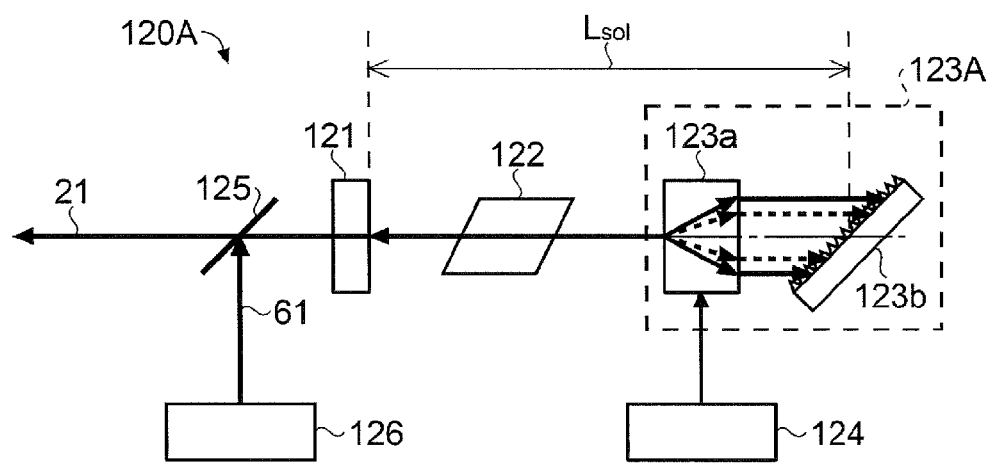
FIG. 13 is a schematic view illustrating the configuration of a master oscillator including a line narrowing module in the first embodiment.

An example of the line narrowing module 123 illustrated in FIG. 12 will now be described in greater detail with reference to a drawing. FIG. 13 schematically illustrates the configuration of a master oscillator 120A including a line narrowing module 123A. The line narrowing module 123A may include a beam expander 123a and a grating 123b as illustrated in FIG. 13. The beam expander 123a may include one or more optical elements, such as prisms and collimator lenses. The grating 123b may function as a rear mirror of an optical resonator. The grating 123b may be arranged in a Littrow mounting with respect to light output from the beam expander 123a. The grating 123b may be a blazed grating. In this case, the grating 123b may be arranged in such a manner that the light output from the beam expander 123a will be incident on the grating at a blaze angle.

With this configuration, the excitation light 61 output from the pumping laser 126 may enter the Ti:sapphire crystal 122 through the beam splitter 125 and the output coupler 121. As a result, the Ti:sapphire crystal 122 may be excited, resulting in laser oscillation between the output coupler 121 and the grating 123b. The beam of the laser light in the optical resonator may be expanded by the beam expander 123a. As a result, the laser light can be incident on the grating 123b at a certain incident angle. The grating 123b may narrow the spectrum of the laser light.

By changing the beam expansion rate of the beam expander 123a, the bandwidth of the spectrum obtained by the grating 123b can be changed. Furthermore, the longitudinal mode spacing can be determined by the resonator length $L_{sol}$ between the output coupler 121 and the grating 123b. The intensity distribution of longitudinal modes, therefore, can be controlled by changing the beam expansion rate of the beam expander 123a.

The beam expansion rate of the beam expander 123a may be adjustable. The driver 124 may drive the beam expander 123a to change the beam expansion rate of the beam expander 123a. If a prism is used as the beam expander 123a, for example, the driver 124 may include a turntable capable of adjusting the angle of the prism with respect to the optical path in the optical resonator. In this case, by rotating the turntable to adjust the angle of the prism with respect to the optical path, the driver 124 can change the beam expansion rate of the beam expander 123a. If a zoom collimator lens is used as the beam expander 123a, the driver 124 may adjust the zoom factor of the collimator lens to change the beam expansion rate of the beam expander 123a. If the master oscillator 120A is employed in place of the master oscillator 100 in the solid-state laser apparatus 10, the controller 430 may control the beam expander 123a through the driver 124. The controller 430 can thus control the spectral linewidth of the laser light produced by the solid-state laser apparatus 10.

With the configuration illustrated in FIG. 13, adjustment of the resonator length $L_{sol}$ of the optical resonator constituted by the output coupler 121 and the grating 123b can control the longitudinal mode spacing of the laser light 21. In addition, adjustment of the beam expansion rate of the beam expander 123a can control the spectral linewidth of the laser light 21.

3.1.1.4 Master Oscillator Including Seed Laser: Third Modification

Figure 14:
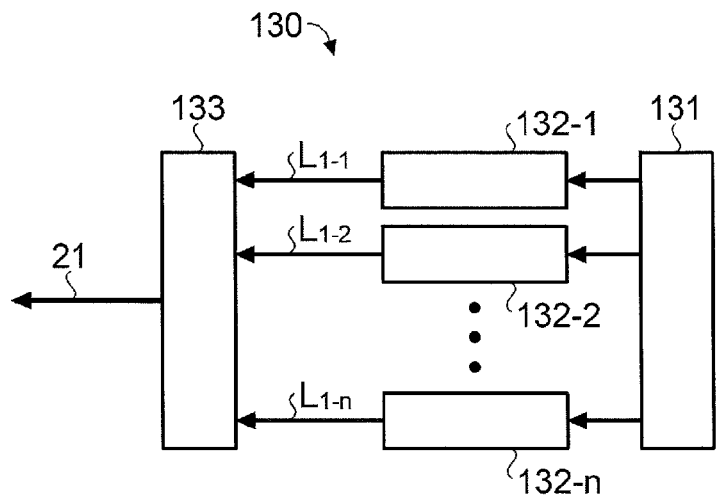
FIG. 14 is a schematic view illustrating the configuration of a master oscillator including a semiconductor laser in the first embodiment.

A third modification of the master oscillator will now be described in detail with a drawing. FIG. 14 schematically illustrates the configuration of a master oscillator 130 including a seed laser that outputs seed light. The master oscillator 130 may include a plurality of semiconductor lasers 132-1 to 132-n as a plurality of seed lasers, an optical path adjuster 133, and a seed laser controller 131 as illustrated in FIG. 14.

Each of the semiconductor lasers 132-1 to 132-n may be a diode laser, for example. Each of the semiconductor lasers 132-1 to 132-n may oscillate in the single longitudinal mode or multi-longitudinal mode. The seed laser controller 131 may control the oscillation wavelength and output intensity of longitudinal mode laser rays $L_{1-1}$ to $L_{1-n}$ which are produced by the semiconductor lasers 132-1 to 132-n, respectively. Through this control, the peaks of the longitudinal modes of the laser light (laser light 21) produced by combining the longitudinal mode laser rays $L_{1-1}$ to $L_{1-n}$ output from the semiconductor lasers 132-1 to 132-n, respectively, have a distribution similar to the spectrum SP illustrated in FIG. 1.

The optical path adjuster 133 may output the laser light 21 having a plurality of longitudinal modes with different wavelengths by aligning the optical paths of the longitudinal mode laser rays $L_{1-1}$ to $L_{1-n}$ output from the semiconductor lasers 132-1 to 132-n, respectively. Examples of the optical path adjuster 133 illustrated in FIG. 14 will now be described in greater detail with reference to some drawings. For the sake of simplifying the explanation, the number of the semiconductor lasers 132-1 to 132-n is five in the following examples.

3.1.1.4.1 Optical Path Adjuster Using a Plurality of Mirrors

Figure 15:
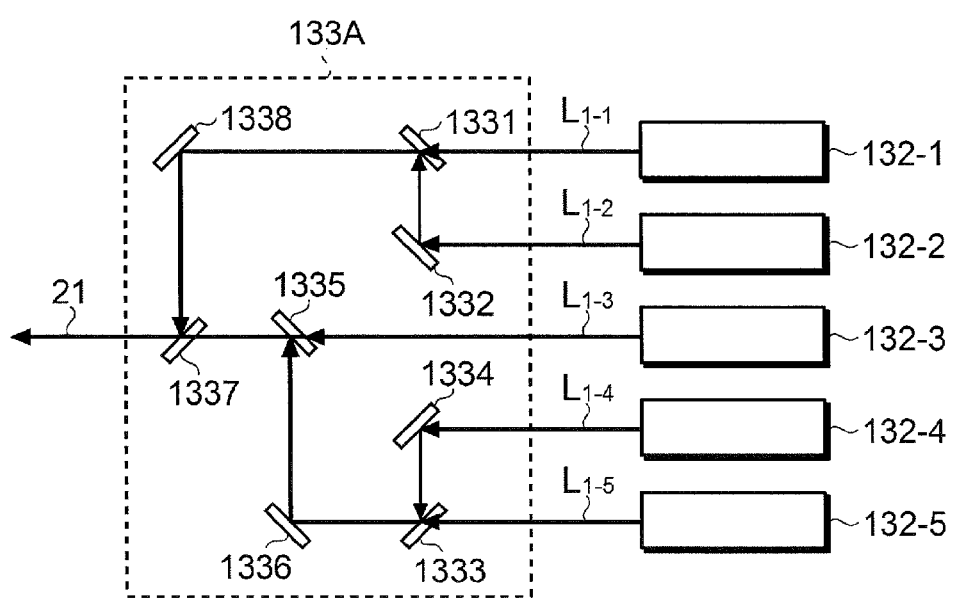
FIG. 15 is a schematic view illustrating an example of the configuration of the optical path adjuster in FIG. 14.

An optical path adjuster 133A using a plurality of mirrors will be first described in detail with reference to a drawing. FIG. 15 schematically illustrates the configuration of the optical path adjuster 133A. In the configuration illustrated in FIG. 15, the longitudinal mode laser ray $L_{1-1}$ output from the semiconductor laser 132-1 may pass through a half mirror 1331, be reflected by a highly reflective mirror 1338, and then reflected by a half mirror 1337. The optical path of the longitudinal mode laser ray $L_{1-1}$ can be thus aligned with the optical path of the laser light 21. The longitudinal mode laser ray $L_{1-2}$ output from the semiconductor laser 132-2 may be reflected by a highly reflective mirror 1332, reflected by the half mirror 1331, reflected by the highly reflective mirror 1338, and then reflected by the half mirror 1337. The optical path of the longitudinal mode laser ray $L_{1-1}$ can be thus aligned with the optical path of the laser light 21. The longitudinal mode laser ray $L_{1-2}$ output from the semiconductor laser 132-2 may be reflected by a half mirror 1332, reflected by the half mirror 1331, reflected by the highly reflective mirror 1338, and then reflected by the half mirror 1337. The optical path of the longitudinal mode laser ray $L_{1-2}$ can be thus aligned with the optical path of the laser light 21. The longitudinal mode laser ray $L_{1-3}$ output from the semiconductor laser 132-3 may pass through a half mirror 1335 and the half mirror 1337. The optical path of the longitudinal mode laser ray $L_{1-3}$ can be thus aligned with the optical path of the laser light 21. The longitudinal mode laser ray $L_{1-4}$ output from the semiconductor laser 132-4 may be reflected by a highly reflective mirror 1334 and a half mirror 1333, reflected by a highly reflective mirror 1336, then reflected by the half mirror 1335, and pass through the half mirror 1337. The optical path of the longitudinal mode laser ray $L_{1-4}$ can be thus aligned with the optical path of the laser light 21. The longitudinal mode laser ray $L_{1-5}$ output from the semiconductor laser 132-5 may pass through the half mirror 1333, be reflected by the highly reflective mirror 1336, then reflected by the half mirror 1335, and pass through the half mirror 1337. The optical path of the longitudinal mode laser ray $L_{1-5}$ can be thus aligned with the optical path of the laser light 21.

Combining a plurality of reflective mirrors and half mirrors as described above may provide the optical path adjuster 133A capable of aligning the optical paths of the longitudinal mode laser rays $L_{1-1}$ to $L_{1-n}$.

3.1.1.4.2 Optical Path Adjuster Using Grating

Figure 16:
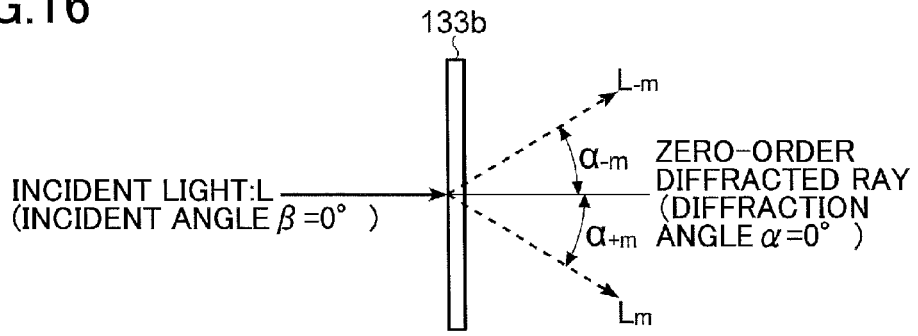
FIG. 16 is a schematic view illustrating ±mth-order diffracted rays of laser light incident at an incident angle β of 0° on a transmissive grating.

An optical path adjuster 133B using a grating 133b will now be described in detail with reference to drawings. FIG. 16 schematically illustrates ±mth-order diffracted rays of laser light L incident at an incident angle β of 0° on this transmissive grating 133b. As illustrated in FIG. 16, the grating 133b may diffract the laser light L incident at an incident angle β being 0° into the ±mth-order diffracted rays $L_{\pm m}$ at diffraction angles $\alpha_{-m}$ and $\alpha_{+m}$ dependent on the wavelength λ of the laser light L, based on its wavelength selectivity (dispersion). The relationship between the diffraction angles $\alpha_{\pm m}$ and the wavelength λ satisfies Formula (4) below. In Formula (4), m is the order of a diffracted ray whose optical path is to be aligned and N is the number of grooves per unit length (mm) in the grating 133. In Formula (4), the incident angle β is set to 0°, and the term related to the incident angle β is omitted therefore.

$$Nm\lambda = \sin \alpha \quad (4)$$

Figure 17:
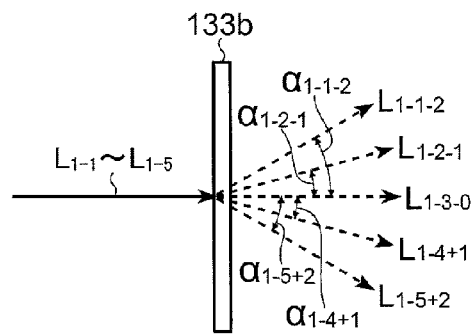
FIG. 17 is a schematic view illustrating diffracted rays of different orders of laser light having a plurality of longitudinal modes incident at an incident angle β of 0° on the grating.

FIG. 17 illustrates diffracted rays $L_{1-1-2}$ $L_{1-2-1}$ $L_{1-3-0}$, $L_{1-4+1}$, and $L_{1-5+2}$ of different orders of the longitudinal mode laser rays $L_{1-1}$ to $L_{1-5}$ incident at an incident angle β of 0° on the grating 133b. As illustrated in FIG. 17, the diffracted rays $L_{1-1-2}$, $L_{1-2-1}$ $L_{1-3-0}$ $L_{1-4+1}$, and $L_{1-5+2}$ of different orders of the longitudinal mode laser rays $L_{1-1}$ to $L_{1-5}$ can be output from the grating 133b in the directions of different diffraction angles $\alpha_{1-1-2}$, $\alpha_{1-4+1}$, and $\alpha_{1-5+2}$. The wavelength of at least one of the longitudinal mode laser rays $L_{1-1}$ to $L_{1-5}$ may be different from the wavelengths of the other longitudinal mode laser rays $L_{1-1}$ to $L_{1-5}$. Alternatively, the wavelengths of all the longitudinal mode laser rays $L_{1-1}$ to $L_{1-5}$ may be the same.

Figure 18:
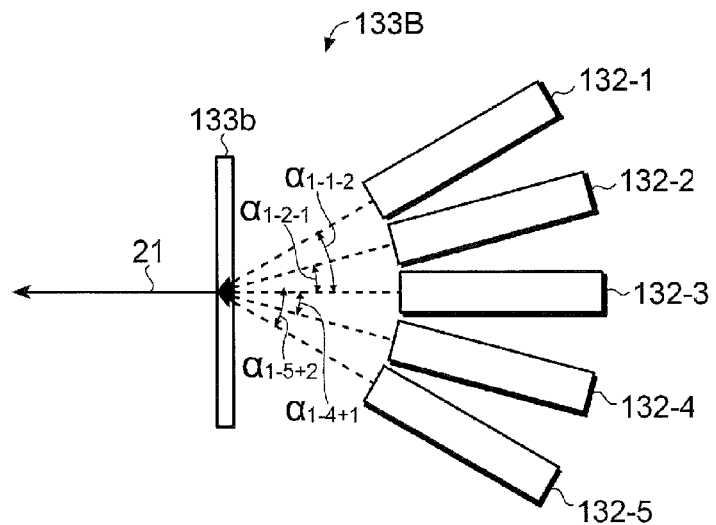
FIG. 18 is a schematic view illustrating another example of the configuration of the optical path adjuster in FIG. 14.

As illustrated in FIG. 18, the longitudinal mode laser rays $L_{1-1}$ to $L_{1-5}$ from the semiconductor lasers 132-1 to 132-5, respectively, may be incident on the grating 133b at the diffraction angles $\alpha_{1-1-2}$ to $\alpha_{1-5+2}$ depending on their wavelengths and target orders. Accordingly, the diffracted rays of different orders of the longitudinal mode laser rays $L_{1-1}$ to $L_{1-5}$ can be emitted in the direction of the same diffraction angle β of 0°. As a result, the laser light 21 composed of the diffracted rays of the longitudinal mode laser rays $L_{1-1}$ to $L_{1-5}$ can be output.

The optical path adjuster 133B described above is applicable to a seed laser including a plurality of solid-state lasers, e.g., Ti:sapphire laser oscillators.

3.1.1.5 Master Oscillator Including Optical Modulator: Fourth Modification

Figure 19:
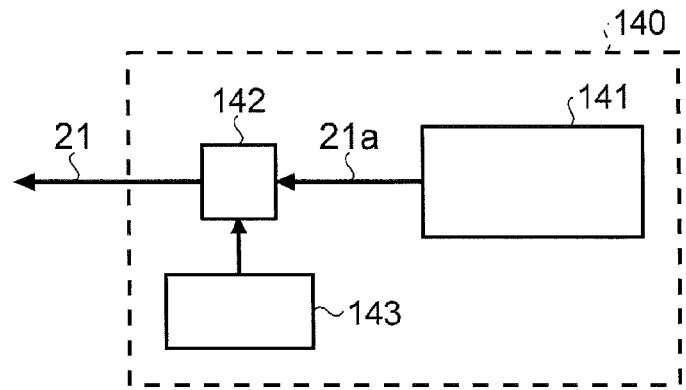
FIG. 19 is a schematic view illustrating the configuration of a master oscillator including an optical modulator in the first embodiment.

A fourth modification of the master oscillator will now be described in detail with reference to FIG. 19. FIG. 19 schematically illustrates the configuration of a master oscillator 140 including an optical modulator. The master oscillator 140 may include a seed laser 141, an optical modulator 142, and a driver 143 as illustrated in FIG. 19. The seed laser 141 may be a semiconductor laser or a solid-state laser, e.g., a Ti:sapphire laser oscillator. The seed laser 141 may oscillate in a wavelength range (e.g., visible range) of high oscillation efficiency. The seed laser 141 may output seed light $21a$ having at least one longitudinal mode.

The optical modulator 142 may optically modulate the seed light $21a$ output from the seed laser 141 to produce the laser light 21 having a plurality of longitudinal modes whose peaks have a distribution similar to the spectrum SP. The driver 143 may control the optical modulator 142 so as to control the center frequency and spectral linewidth of the laser light 21 output from the optical modulator 142. A couple of examples of the optical modulator 142 illustrated in FIG. 19 will be described in detail with reference to some drawings.

3.1.1.5.1 Optical Modulator Using Electro-Optic Element

Figure 20:
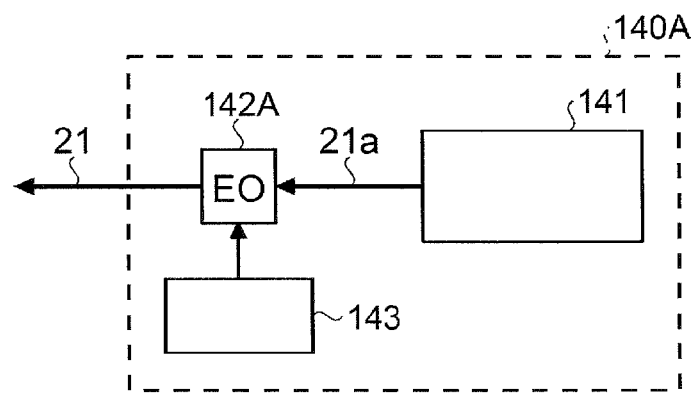
FIG. 20 is a schematic view illustrating the configuration of a master oscillator including an electro-optic element as the optical modulator in the first embodiment.
Figure 21:
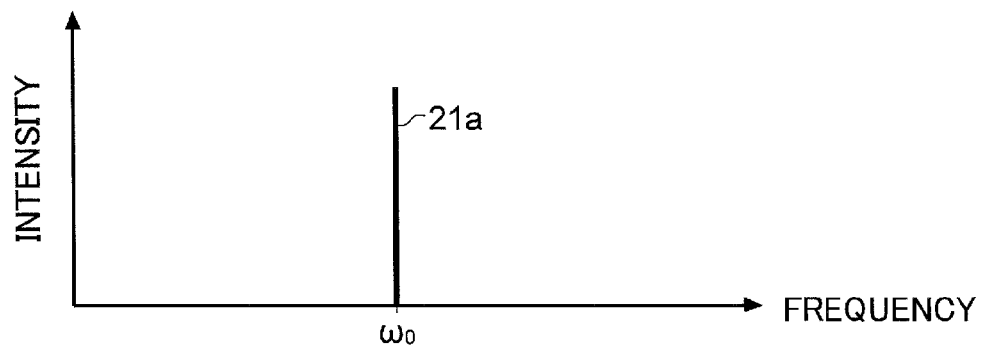
FIG. 21 is a chart illustrating an example of seed light output from the seed laser in FIG. 20.
Figure 22:
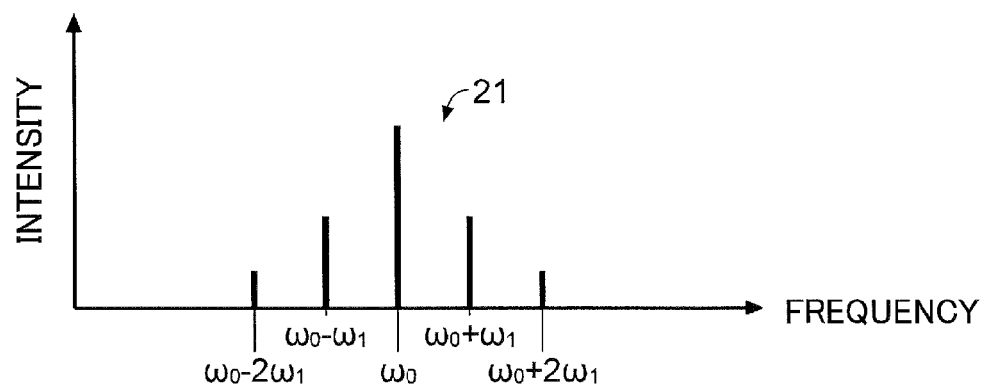
FIG. 22 is a chart illustrating an example of laser light output from the electro-optic element in FIG. 20.

The optical modulator 142 using an electro-optic element (EO) 142A will be described in detail with reference to drawings. FIG. 20 schematically illustrates the configuration of a master oscillator 140A including this electro-optic element 142A as the optical modulator 142. FIG. 21 illustrates an example of the seed light $21a$ output from the seed laser 141 in FIG. 20. FIG. 22 illustrates an example of the laser light 21 output from the electro-optic element 142A.

The master oscillator 140A may include the electro-optic element 142A as the optical modulator 142 as illustrated in FIG. 20. The electro-optic element 142A may modulate the phase of the seed light $21a$ output from the seed laser 141 to produce the laser light 21 having a larger number of longitudinal modes than the seed light $21a$.

The electro-optic element 142A may be an optical modulator that modulates the phase of light passing therethrough with an electro-optic effect of electro-optic crystal, e.g., lithium niobate ($LiNbO_3$). The refractive index of electro-optic crystal can be changed with voltage applied to the crystal, which is referred to as the Pockels effect. In other words, the electro-optic element 142A may be a Pockels cell. With voltage applied to the electro-optic element 142A, the refractive index of the electro-optic element 142A can be changed depending on the intensity of an electric field resulting from the voltage application. In this process, the optical path length of the seed light $21a$ passing through the electro-optic element 142A is changed, whereby the phase of the seed light $21a$ can be modified. This results in a frequency shift of the seed light $21a$, and the spectral linewidth can be expanded. Here, voltage may be applied to the electro-optic element 142A for periodically changing the phase. The seed light 21a output from the seed laser 141 can be thus converted into the laser light 21 having a larger number of longitudinal modes. The longitudinal mode spacing of the laser light 21 after being converted can be determined by the frequency of the applied voltage. The total spectral linewidth of the laser light 21 after being converted can be determined by the magnitude of phase modulation, that is, the magnitude of the applied voltage that determines the refractive index. A frequency modulator may alternatively be used.

FIG. 21 illustrates an example in which the seed laser 141 outputs the seed light 21a having the single longitudinal mode. In this case, the wavelength corresponding to the center frequency $\omega_0$ of the seed light 21a may be 773.6 nm. Supposing that a voltage changing at a frequency $\omega_1$ is applied to the electro-optic element 142A, this frequency $\omega_1$ may be about 150 MHz, for example. As a result, the seed light 21a having entered the electro-optic element 142A can be converted into the laser light 21 having the multi-longitudinal mode with a longitudinal mode spacing of $\omega_1$ as illustrated in FIG. 22.

The driver 143 may apply voltage to the electro-optic element 142A. The driver 143 may control the magnitude (amplitude) and frequency of the voltage to be applied to the electro-optic element 142A. The driver 143 can thus control the spectral linewidth and longitudinal mode spacing of the laser light 21 produced by the electro-optic element 142A. In the case of an excimer laser, for example, supposing that the longitudinal mode spacing of the laser light 20 output from the solid-state laser apparatus 10 is $\Delta\omega_{gas}(=C/2L_{EXC})$, it may suffice for the longitudinal mode spacing $\omega_1$ of the laser light 21 produced by the electro-optic element 142A to be $\Delta\omega_{gas}$ or less. To satisfy this condition, the frequency of the voltage applied to the electro-optic element 142A may be set to $\Delta\omega_{gas}$ or less.

By thus using the electro-optic element 142A, the laser light 21 having a plurality of longitudinal modes can be produced from the seed light 21a having the single longitudinal mode output from the seed laser 141. Restrictions on the resonator length of the seed laser 141 can be thus reduced.

3.1.1.5.2 Optical Modulator Using Optoacoustic Elements

Figure 23:
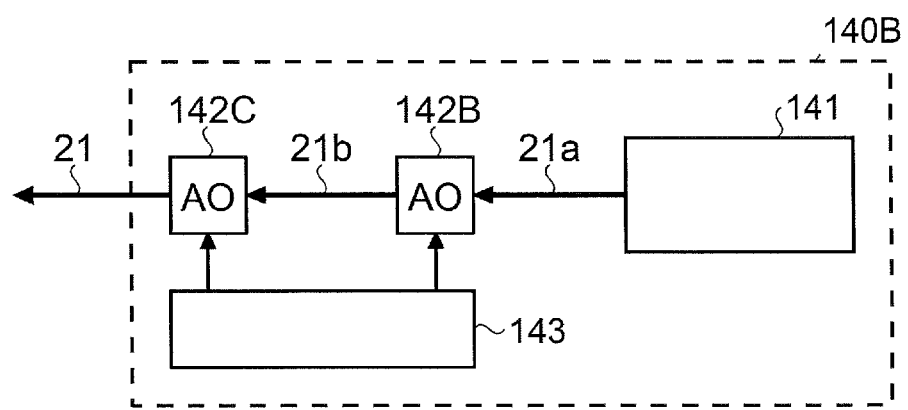
FIG. 23 is a schematic view illustrating the configuration of a master oscillator including optoacoustic elements as the optical modulator in the first embodiment.
Figure 24:
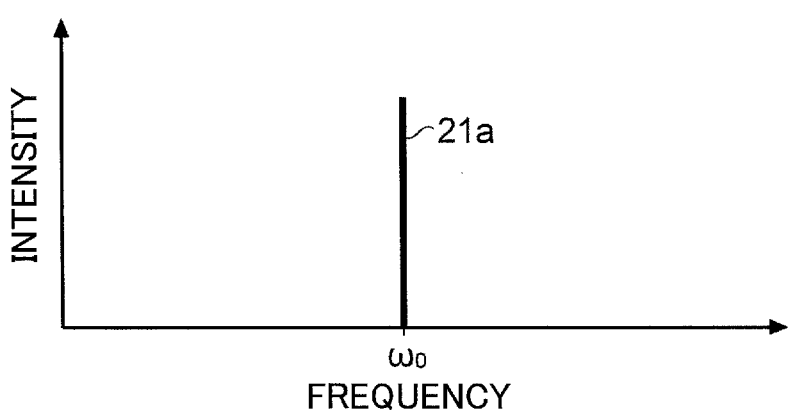
FIG. 24 is a chart illustrating an example of seed light output from the seed laser in FIG. 23.
Figure 25:
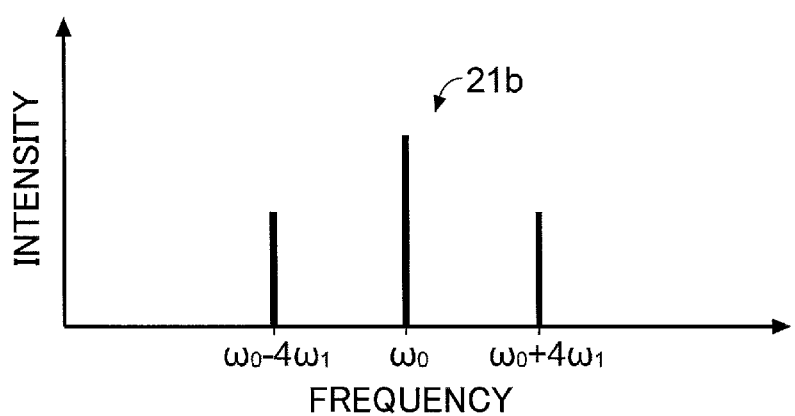
FIG. 25 is a chart illustrating an example of laser light output from the first optoacoustic element in FIG. 23.
Figure 26:
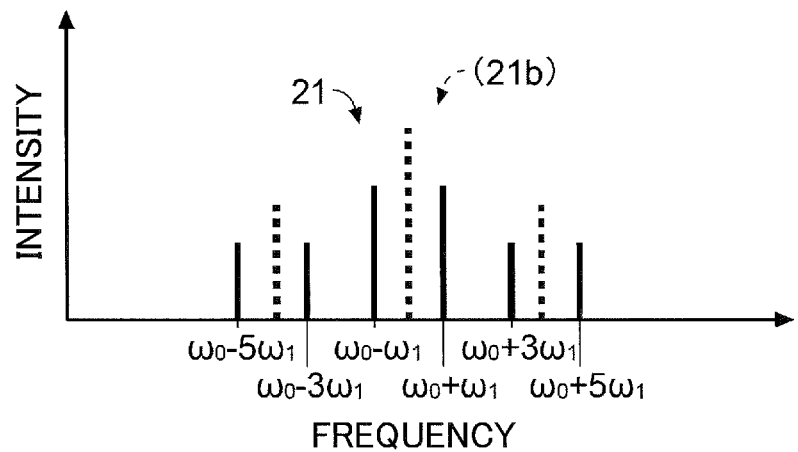
FIG. 26 is a chart illustrating an example of laser light output from the second optoacoustic element in FIG. 23.

The optical modulator 142 using optoacoustic elements (AO) will be described in detail with reference to drawings. FIG. 23 schematically illustrates the configuration of a master oscillator 140B including optoacoustic elements 142B and 142C as the optical modulator 142. FIG. 24 illustrates an example of the seed light 21a output from the seed laser 141 in FIG. 23. FIG. 25 illustrates an example of laser light 21b output from the optoacoustic element 142B. FIG. 26 illustrates an example of the laser light 21 output from the optoacoustic element 142C.

The master oscillator 140B may include the two optoacoustic elements 142B and 142C as the optical modulator 142 as illustrated in FIG. 23. The optoacoustic element 142B may diffract the seed light 21a output from the seed laser 141 to produce the laser light 21b having a larger number of longitudinal modes than the seed light 21a. The optoacoustic element 142C may diffract the seed light 21b output from the optoacoustic element 142B to produce the laser light 21 having a larger number of longitudinal modes than the laser light 21b.

Each of the optoacoustic elements 142B and 142C may be an optical modulator that modulates the intensity of light passing therethrough with an optoacoustic effect of optoacoustic crystal, e.g., lithium niobate (LiNbO$_3$). An input of ultrasound or other acoustic wave in optoacoustic crystal can result in a diffraction grating of a compression wave produced in the crystal. As laser light is incident on the optoacoustic element in which the acoustic wave has been input, the laser light passing through the optoacoustic crystal can be diffracted due to the Raman-Nath effect. By designing the optical axis of a laser apparatus in alignment with the optical path of the laser light with or without an input of an acoustic wave in the optoacoustic crystal, the intensity of the output laser light can be changed with a selective input of the acoustic wave. In this manner, the master oscillator 140B using the optoacoustic elements as the optical modulator 142 can set the degree of modulation using diffraction efficiency. Furthermore, the master oscillator 140B can set the modulation frequency using the on/off periods of the acoustic wave. For example, the diffraction efficiency of the optoacoustic element 142B may be about 50%, while the diffraction efficiency of the optoacoustic element 142C may be about 100%. The longitudinal mode spacing of the ultimately obtained laser light 21 having the multi-longitudinal mode may be $2\omega_1$. The longitudinal mode spacing $2\omega_1$ may be the above-mentioned longitudinal mode spacing $\Delta\omega_{gas}$ or less. To this end, the condition of $2\omega_1=\Delta\omega_{gas}$ may be achieved, for example.

FIG. 24 illustrates an example in which the seed laser 141 outputs the seed light 21a having the single longitudinal mode. In this case, the wavelength corresponding to the center frequency $\omega_0$ of the seed light 21a may be 773.6 nm. The pulse width may be 10 ns to 20 ns. Under these conditions, the optoacoustic element 142B may modulate the intensity of the seed light 21a at a diffraction efficiency of 50% and a modulation frequency of $4\omega_1$ (e.g., 300 MHz). As a result, the seed light 21a can be converted into the laser light 21b having the multi-longitudinal mode of three longitudinal modes with a longitudinal mode spacing of $4\omega_1$ and a spectral linewidth of $8\omega_1$ as illustrated in FIG. 25. Optical modulation in this process can be represented by Formula (5) below.

$$\sin\omega_0 t \times (0.5 + 0.5\sin 4\omega_1 t) = 0.5\sin\omega_0 t + 0.5\sin\omega_0 t \cdot \sin 4\omega_1 t \quad (5)$$
$$= 0.5\sin\omega_0 t + 0.25$$
$$\{\cos(\omega_0 - 4\omega_1)t - \cos(\omega_0 + 4\omega_1)t\}$$
$$= 0.5\sin\omega_0 t + 0.25\cos(\omega_0 - 4\omega_1)t -$$
$$0.25\cos(\omega_0 + 4\omega_1)t$$

The laser light 21b having the multi-longitudinal mode output from the optoacoustic element 142B may be input into the optoacoustic element 142C. The optoacoustic element 142C may modulate the intensity of the laser light 21b at a diffraction efficiency of 100% and a modulation frequency of $\omega_1$ (e.g., 75 MHz). As a result, the laser light 21b can be converted into the laser light 21 having the multi-longitudinal mode of six longitudinal modes with a longitudinal mode spacing of $2\omega_1$ (e.g., 150 MHz) and a spectral linewidth of $10\omega_1$ as illustrated in FIG. 26. Optical modulation in this process can be represented by Formula (6) below.

$$\begin{aligned}\frac{\{\sin\omega_0 t \times (0.5 + 0.5\sin 4\omega_1 t)\} \times}{\sin\omega_1 t} &= 0.5\sin\omega_0 t \times \sin\omega_1 t + \\ &\quad 0.25\cos(\omega_0 - 4\omega_1)t \times \sin\omega_1 t - \\ &\quad 0.25\cos(\omega_0 + 4\omega_1)t \times \sin\omega_1 t \\ &= 0.25\{\cos(\omega_0 - \omega_1)t - \cos(\omega_0 + \omega_1)t\} + \\ &\quad 0.125\{\sin(\omega_0 - 3\omega_1)t + \sin(-\omega_0 + 5\omega_1)t\} - \\ &\quad 0.125\{\sin(\omega_0 + 5\omega_1)t + \sin(-\omega_0 - 3\omega_1)t\} \\ &= 0.25\cos(\omega_0 - \omega_1)t - 0.25\cos(\omega_0 + \omega_1)t + \\ &\quad 0.125\sin(\omega_0 - 3\omega_1)t - 0.125\sin(\omega_0 - 5\omega_1)t - \\ &\quad 0.125\sin(\omega_0 + 5\omega_1)t + 0.125\sin(\omega_0 + 3\omega_1)t\end{aligned} \quad (6)$$

By thus using the optoacoustic elements 142B and 142C, the laser light 21 having a plurality of longitudinal modes can be produced from the seed light 21a having the single longitudinal mode output from the seed laser 141. Restrictions on the resonator length of the seed laser 141 can be thus reduced.

3.1.2 Amplifier

Examples of the amplifier 200 included the solid-state laser apparatus 10 illustrated in FIG. 3 will now be described. The amplifier 200 may be various types of amplifiers including power oscillators, power amplifiers, and regenerative amplifiers. The amplifier 200 may be a single amplifier or include a plurality of amplifiers. Some specific examples of the amplifier 200 will be given below. While the master oscillator 100 is used in the following examples, any of the other aforementioned master oscillators is also applicable. If the master oscillator 100 is capable of outputting the laser light 21 with sufficient intensity, the amplifier 200 may be omitted.

3.1.2.1 Fabry-Perot Power Oscillator

Figure 27:
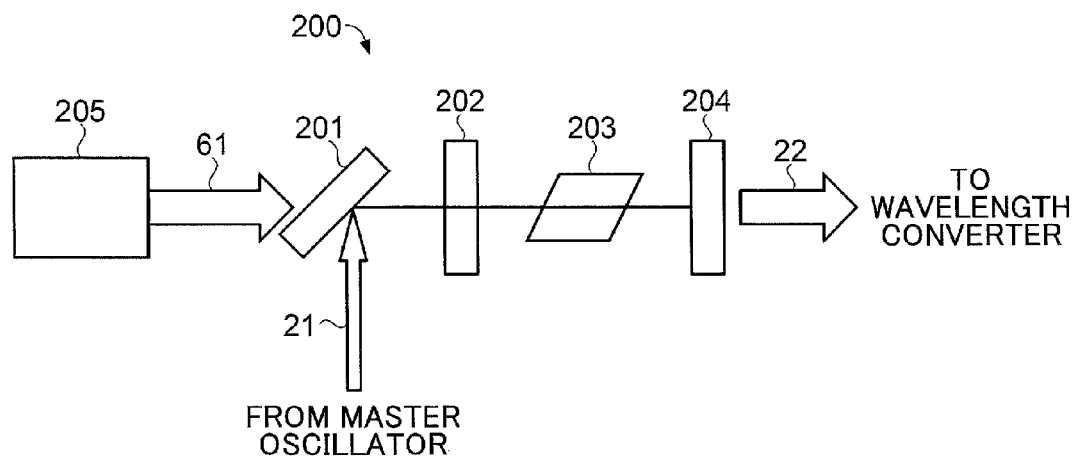
FIG. 27 is a schematic view illustrating the configuration of an amplifier structured as a Fabry-Perot power oscillator in the first embodiment.

An example in which a Fabry-Perot power oscillator is used as the amplifier 200 will be described first. FIG. 27 schematically illustrates the configuration of the amplifier 200 structured as a Fabry-Perot power oscillator. The amplifier 200 may include a highly reflective mirror 202, an output coupler 204, a Ti:sapphire crystal 203 as a gain medium, a highly reflective mirror 201, and a pumping laser 205 as illustrated in FIG. 27. The pumping laser 205 may be a common pumping laser shared with the master oscillator 100.

The highly reflective mirror 202 and the output coupler 204 may constitute an optical resonator. The Ti:sapphire crystal 203 may be arranged on the optical path in the optical resonator constituted by the highly reflective mirror 202 and the output coupler 204. The highly reflective mirror 201 may guide the laser light 21 from the master oscillator 100 and the excitation light 61 from the pumping laser 205 to the optical resonator.

Specifically, the highly reflective mirror 201 may reflect the laser light 21 from the master oscillator 100 toward the optical resonator. The highly reflective mirror 201 may also transmit the excitation light 61 from the pumping laser 205 toward the optical resonator. The highly reflective mirror 202 serving as one end of the optical resonator may transmit the laser light 21 and the excitation light 61. In this manner, the laser light 21 and the excitation light 61 may be introduced into the optical resonator. The highly reflective mirror 202 may also reflect the laser light emitted from the Ti:sapphire crystal 203.

The laser light 21 and the excitation light 61 having entered the optical resonator through the highly reflective mirror 202 may enter the Ti:sapphire crystal 203. The light incident/output end surfaces of the Ti:sapphire crystal 203 may be Brewster-cut. The laser light emitted from the Ti:sapphire crystal 203 may reciprocate in the optical resonator constituted by the highly reflective mirror 202 and the output coupler 204. As a result, pumped-up laser light may be output from the Ti:sapphire crystal 203. The laser light emitted from the Ti:sapphire crystal 203 may be output as the laser light 22 through the output coupler 204.

3.1.2.2 Ring Power Oscillator: First Modification

Figure 28:
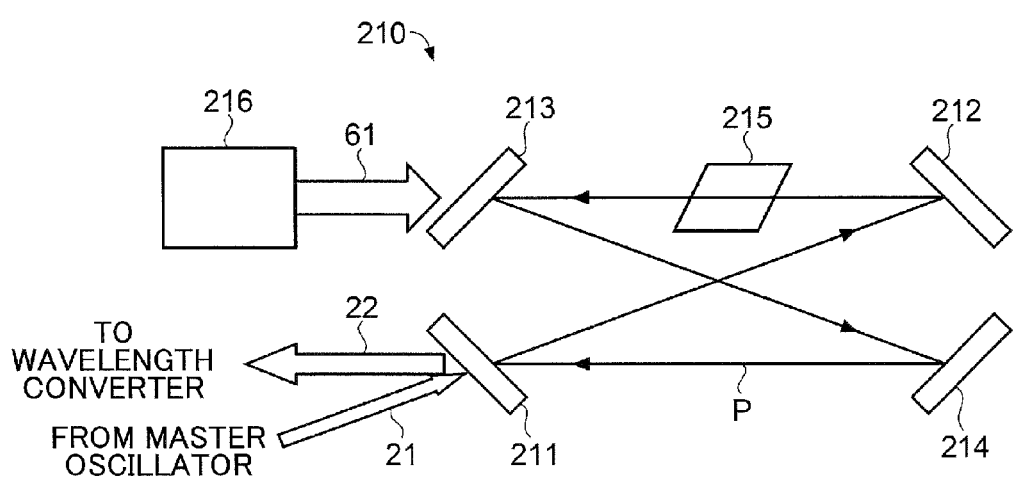
FIG. 28 is a schematic view illustrating the configuration of an amplifier structured as a ring power oscillator in the first embodiment.

A first modification of the amplifier 200 will now be described in detail with reference to a drawing. FIG. 28 schematically illustrates the configuration of an amplifier 210 structured as a ring power oscillator. The amplifier 210 may include an input/output coupler 211, highly reflective mirrors 212 to 214, a Ti:sapphire crystal 215 as a gain medium, and a pumping laser 216 as illustrated in FIG. 28. The pumping laser 216 may be a common pumping laser shared with the master oscillator 100.

The input/output coupler 211 and the highly reflective mirrors 212 to 214 may constitute an optical resonator whose optical path P is ring-shaped (the shape of letter "8"). The Ti:sapphire crystal 215 may be arranged on the optical path P in the optical resonator constituted by the input/output coupler 211 and the highly reflective mirrors 212 to 214.

In this configuration, the input/output coupler 211 may transmit the laser light 21 from the master oscillator 100 and reflect laser light from the Ti:sapphire crystal 215. The input/output coupler 211 may transmit the laser light from the Ti:sapphire crystal 215. The highly reflective mirror 213 may transmit the excitation light 61 from the pumping laser 216 toward the optical resonator and reflect the laser light from the Ti:sapphire crystal 215. The laser light 21 introduced into the optical resonator may travel along the ring-shaped (shape of letter "8") optical path P constituted by the input/output coupler 211 and the highly reflective mirrors 212 to 214. The laser light pumped up by the Ti:sapphire crystal 215 while traveling along the optical path P may be output as the laser light 22 through the input/output coupler 211. By using the amplifier 210 structured as a ring power oscillator in this manner, the laser light 21 can be amplified more efficiently than in the case of a Fabry-Perot laser, for example. In addition, by disposing the input/output coupler 211 with a comparatively low reflectance at an incident end on which the laser light 21 is incident, the lower limit of the intensity of the laser light 21 can be suppressed.

3.1.2.3 Regenerative Amplifier: Second Modification

Figure 29:
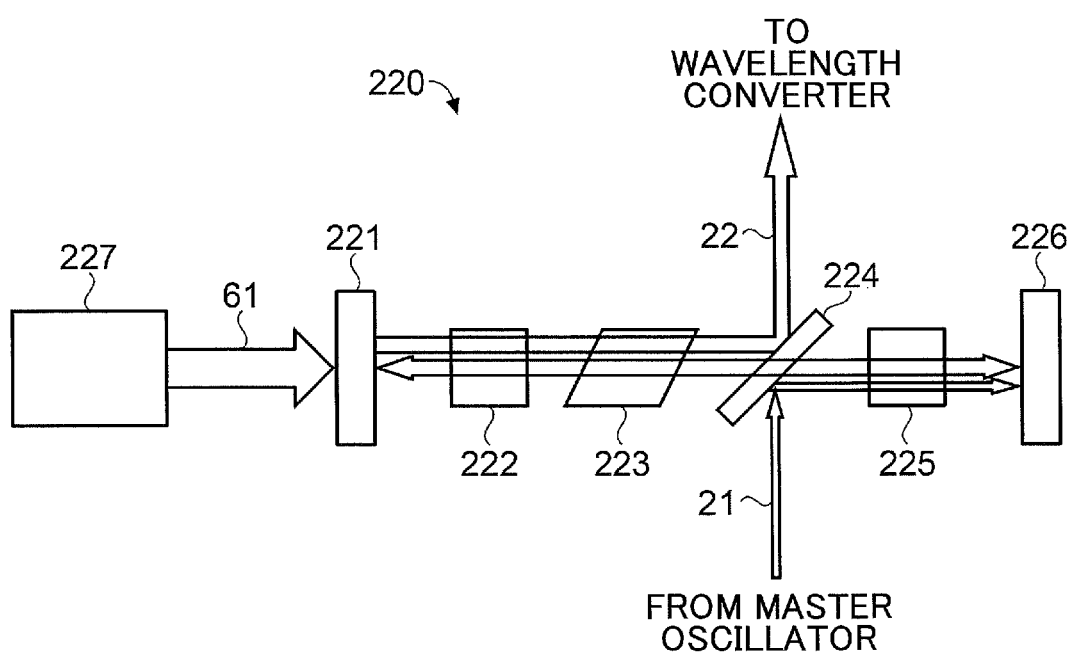
FIG. 29 is a schematic view illustrating the configuration of a regenerative amplifier in the first embodiment.

A second modification of the amplifier 200 will now be described in detail with reference to a drawing. The second modification of the amplifier 200 may include a regenerative amplifier 220 as the amplifier 200. FIG. 29 schematically illustrates the configuration of the regenerative amplifier 220. The regenerative amplifier 220 may include highly reflective mirrors 221 and 226, a Pockels cell 222, a Ti:sapphire crystal 223 as a gain medium, a polarizing beam splitter 224, another Pockels cell 225, and a pumping laser 227 as illustrated in FIG. 29. The pumping laser 227 may be a common pumping laser shared with the master oscillator 100.

The highly reflective mirrors 221 and 226 may constitute an optical resonator. The Pockels cell 222, the Ti:sapphire crystal 223, the polarizing beam splitter 224, and the Pockels cell 225 may be arranged on the optical path in the optical resonator constituted by the highly reflective mirrors 221 and 226. The Pockels cells 222 and 225 may serve as quarter-wave plates during the application of voltage, for example.

In this configuration, laser light 21 S-polarized with respect to the incident surface of the polarizing beam splitter 224 may be incident from the master oscillator 100, for example. The laser light 21 may be first incident on the polarizing beam splitter 224 that is tilted 45 degrees with respect to the optical path in the optical resonator. The polarizing beam splitter 224 may reflect S-polarized light and transmit P-polarized light with respect to the incident surface, for example. In this case, the laser light 21 from the master oscillator 100 can be reflected by the polarizing beam splitter 224 and be guided to the optical resonator. Here, voltage may be applied to the Pockels cell 225 only. In this manner, the laser light 21 having passed through the Pockels cell 225 twice by being reflected by the highly reflective mirror 226 can be converted into laser light P-polarized with respect to the light incident surface of the polarizing beam splitter 224. Voltage may be applied to the Pockels cell 225 only during a period in which the laser light 21 is introduced into the optical resonator. Subsequently, the application of voltage to the Pockels cell 225 may be stopped. With this arrangement, no change occurs in the polarization state of the laser light 21 in the optical resonator, whereby the laser light 21 can be confined in the optical resonator. The confined laser light 21 may reciprocate in the optical resonator once or more. The laser light 21 reciprocating in the optical resonator may be regeneratively amplified upon passing through the Ti:sapphire crystal 223 multiple times. Subsequently, voltage may be applied to the Pockels cell 222. In this manner, the laser light 21 having passed through the Pockels cell 222 twice by being reflected by the highly reflective mirror 221 can be converted into laser light 21 S-polarized with respect to the light incident surface of the polarizing beam splitter 224. As a result, the laser light 21 can be reflected by the polarizing beam splitter 224 and output as the laser light 22.

3.1.2.4 Multipath Power Amplifier: Third Modification

Figure 30:
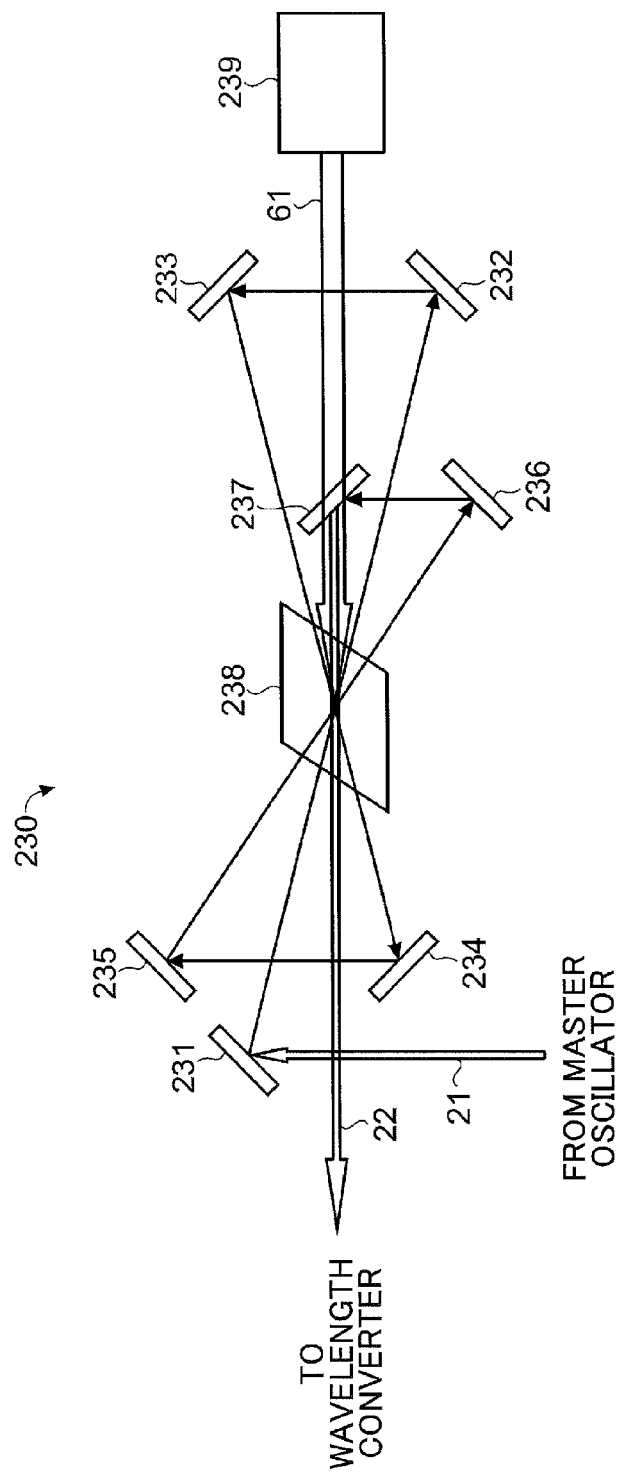
FIG. 30 is a schematic view illustrating the configuration of an amplifier structured as a multipath power amplifier in the first embodiment.

A third modification of the amplifier 200 will now be described in detail with reference to a drawing. FIG. 30 schematically illustrates the configuration of an amplifier 230 structured as a multipath power amplifier. The amplifier 230 may include a plurality of highly reflective mirrors 231 to 237, a Ti:sapphire crystal 238 as a gain medium, and a pumping laser 239 as illustrated in FIG. 30. The pumping laser 239 may be a common pumping laser shared with the master oscillator 100.

The highly reflective mirrors 231 to 237 may constitute a multipath along which the laser light 21 from the master oscillator 100 passes through the Ti:sapphire crystal 238 multiple times (four times in this example). The excitation light 61 from the pumping laser 239 may enter the Ti:sapphire crystal 238 through the highly reflective mirror 237. Specifically, the highly reflective mirror 237 may transmit the excitation light 61 and reflect laser light from the Ti:sapphire crystal 238. In this case, the laser light 21 can be amplified through the multipath upon passing through the Ti:sapphire crystal 238 multiple times. The laser light after being amplified through the multipath may be output as the laser light 22.

3.1.3 Wavelength Converter

Examples of the wavelength converter 300 included in the solid-state laser apparatus 10 illustrated in FIG. 3 will now be described. While the master oscillator 100 is used in the following example, any of the other aforementioned master oscillators is also applicable.

3.1.3.1 Wavelength Converter Using BBO Crystal and KBBF Crystal

Figure 31:
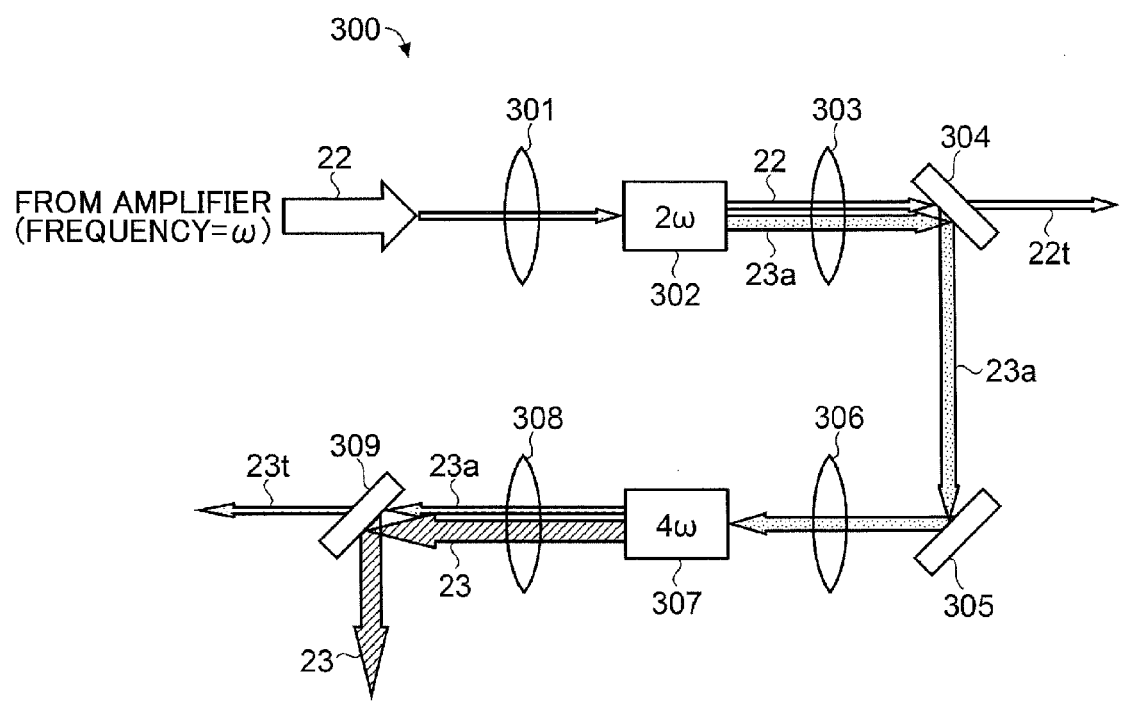
FIG. 31 is a schematic view illustrating the configuration of a wavelength converter including two second harmonic generation (SHG) crystals in the first embodiment.

FIG. 31 schematically illustrates the configuration of the wavelength converter 300 including two second harmonic generation (SHG) crystals. In the following description, a second harmonic generated in a second SHG crystal based on a second harmonic generated in a first SHG crystal is referred to as a fourth harmonic.

The wavelength converter 300 may include a condenser lens 301, a beta barium borate (BBO) crystal 302 that is the first SHG crystal, a collimator lens 303, highly reflective mirrors 304 and 305, another condenser lens 306, a $KBe_2BO_3F_2$ (KBBF) crystal 307 that is the second SHG crystal, another collimator lens 308, and a highly reflective mirror 309 as illustrated in FIG. 31.

The laser light 22 output from the amplifier 200 may be first condensed by the condenser lens 301 onto the BBO crystal 302. The laser light 22 may be a fundamental wave upon which harmonics are based. The center frequency of the fundamental wave may be $\omega$ ($=2\pi\nu$), for example. The center wavelength of the fundamental wave may be 772 nm. The total spectral linewidth of the fundamental wave may be 1.2 μm.

The BBO crystal 302 may emit laser light 23a that is second harmonic light in response to the incident laser light 22. The laser light 23a may have a center frequency of $2\omega$, a center wavelength of 386 nm, and a spectral linewidth of 0.6 μm, for example. The laser light 23a emitted from the BBO crystal 302 may be collimated by the collimator lens 303. The collimated laser light 23a may enter the condenser lens 306 via the highly reflective mirrors 304 and 305. The condenser lens 306 may condense the incident laser light 23a onto the KBBF crystal 307. The highly reflective mirror 304 may reflect the laser light (laser light 23a) with a frequency of $2\omega$ and transmit the laser light (laser light 22t) with a frequency of $\omega$. Accordingly, only the laser light 23a with a frequency of $2\omega$ can be guided to the KBBF crystal 307.

The KBBF crystal 307 is considered to be suitable for wavelength conversion into vacuum ultraviolet light of approximately 193 nm. The KBBF crystal 307 may emit the laser light 23 that is the second harmonic light (fourth harmonic light) in response to the incident laser light 23a serving as a fundamental wave with a center frequency of $2\omega$. The laser light 23 may have a center frequency of $2 \times 2\omega = 4\omega$, a center wavelength of 193 nm, and a spectral linewidth of 0.3 μm, for example. The laser light 23 emitted from the KBBF crystal 307 may be collimated by the collimator lens 308. The collimated laser light 23 may be incident on the highly reflective mirror 309. The highly reflective mirror 309 may transmit the laser light (laser light 23t) with a frequency of $2\omega$ and reflect the laser light (laser light 23) with a center frequency of $4\omega$. Accordingly, the laser light 23 with a center frequency of $4\omega$ can be output from the wavelength converter 300.

Figure 32:
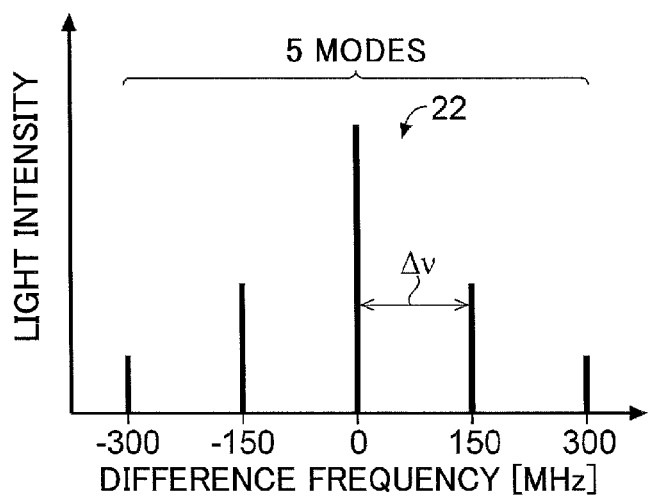
FIG. 32 is a chart illustrating laser light output from the amplifier in the first embodiment.

Inputting laser light having a plurality of longitudinal modes into the SHG crystals, such as the BBO and KBBF crystals, can result in, besides simple second harmonic light, sum frequency and difference frequency produced at the longitudinal mode spacing of the laser light. As a result, the form of the spectrum of the laser light can be changed. A detail description will be given with respect to FIGS. 32 to 34. FIG. 32 illustrates the laser light 22 output from the amplifier 200 (or the laser light 21 output from the master oscillator 100).

Figure 33:
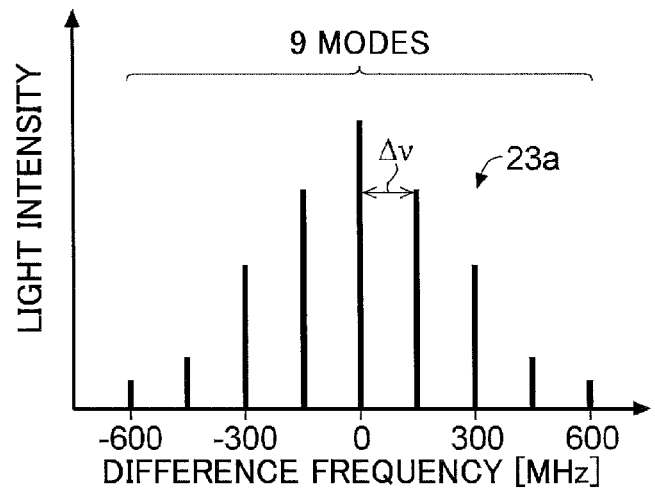
FIG. 33 is a chart illustrating second harmonic light output from a beta barium borate (BBO) crystal with the laser light in FIG. 32 entering the crystal.
Figure 34:
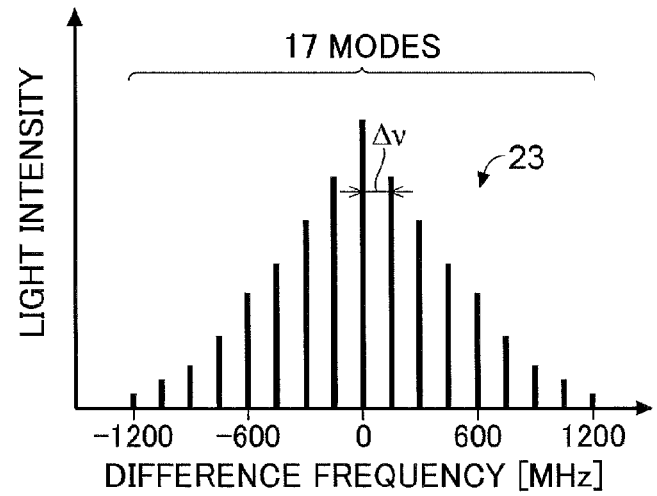
FIG. 34 is a chart illustrating fourth harmonic light output from a $KBe_2BO_3F_2$ (KBBF) crystal with the laser light in FIG. 33 entering the crystal.

FIG. 33 illustrates second harmonic light (laser light 23a) output from the BBO crystal 302 with the laser light 22 in FIG. 32 entering the crystal. FIG. 34 illustrates fourth harmonic light (laser light 23) output from the KBBF crystal 307 with the laser light 23a in FIG. 33 entering the crystal. In FIGS. 32 to 34, the horizontal axis represents a frequency difference between the center frequency and each spectrum and the vertical axis represents the light intensity of each spectrum.

FIG. 32 illustrates an example in which the amplifier 200 (or the master oscillator 100) outputs the laser light 22 having five longitudinal modes with a longitudinal mode spacing $\Delta v$ of 150 MHz and a total spectral linewidth of 600 MHz (=1.2 μm). In this case, the BBO crystal 302 can output the laser light 23a having nine longitudinal modes with a total spectral linewidth of 1.2 GHz (=0.6 μm) as illustrated in FIG. 33. It should be noted that the longitudinal mode spacing $\Delta v$ of the laser light 23a can remain the same as that of the laser light 22, namely, 150 MHz. In addition, the KBBF crystal 307 can output the laser light 23 having 17 longitudinal modes with a total spectral linewidth of 2.4 GHz (=0.3 μm) as illustrated in FIG. 34. Again, it should be noted that the longitudinal mode spacing $\Delta v$ of the laser light 23 can remain the same as that of the laser light 22 and the laser light 23a, namely, 150 MHz.

In this manner, the BBO crystal 302 and the KBBF crystal 307 can generate second harmonic light or fourth harmonic light at the longitudinal mode spacing $\Delta v$ of the laser light 22 (or laser light 21), which is a fundamental wave. As a result, the laser light 20 having a spectrum that substantially approximates the desired spectrum SP can be produced.

A spectral form required for semiconductor exposure may be variable depending on exposure conditions. Furthermore, the spectrum (spectral form) of the laser light 23 output from the wavelength converter 300 can be changed depending on the spectrum of the laser light 22 input into the wavelength converter 300. Accordingly, when the master oscillator 140B in FIG. 23 including the optoacoustic elements 142B and 142C as the optical modulator 142 is used, it is preferable to adjust the spectrum of the laser light 23a produced by the optoacoustic element 142B and the spectrum of the laser light 23 produced by the optoacoustic element 142C in such a manner that the laser light 20 having a desirable spectral form can be output from the solid-state laser apparatus 10. This intensity distribution can be controlled by setting intensity modulation by the optoacoustic elements 142B and 142C for the laser light 22 or 23a.

Figure 35:
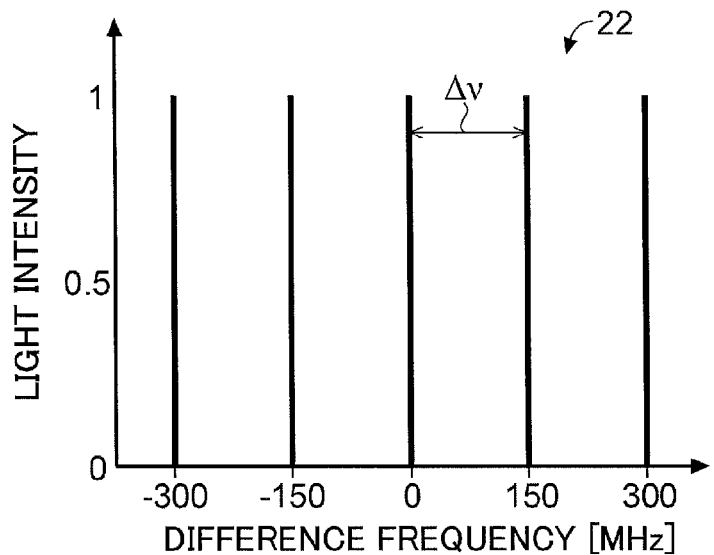
FIG. 35 is a chart illustrating an example of laser light input as a fundamental wave in the wavelength converter in the first embodiment.
Figure 36:
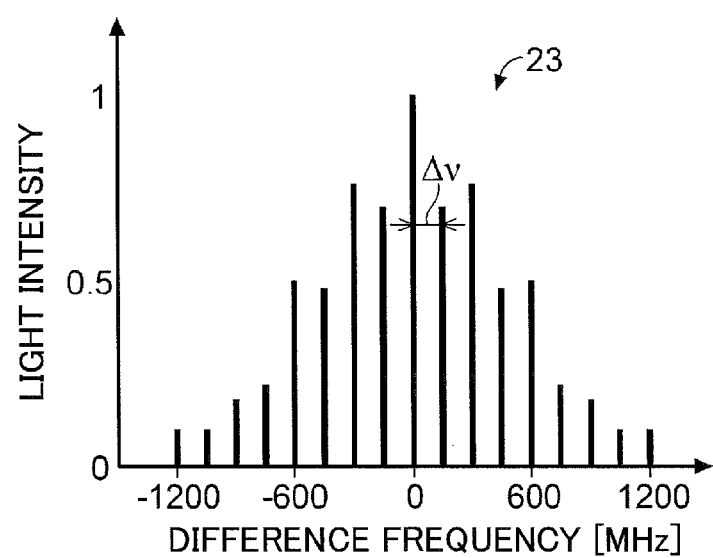
FIG. 36 is a chart illustrating the fourth harmonic light of the laser light in FIG. 35 as a fundamental wave entering the BBO and KBBF crystals.
Figure 37:
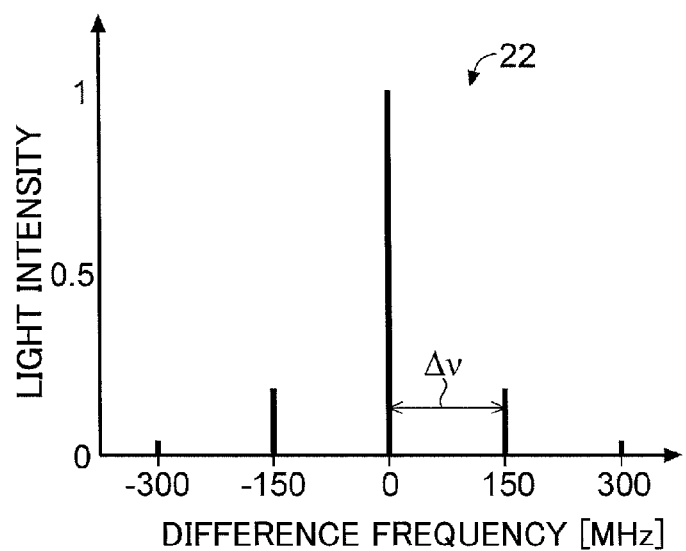
FIG. 37 is a chart illustrating another example of laser light input as a fundamental wave in the wavelength converter in the first embodiment.
Figure 38:
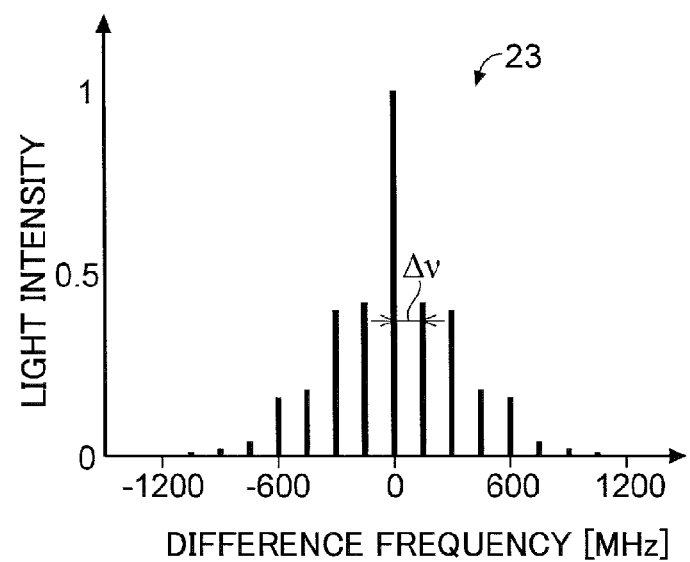
FIG. 38 is a chart illustrating the fourth harmonic light of the laser light in FIG. 37 as a fundamental wave entering the BBO and KBBF crystals.
Figure 39:
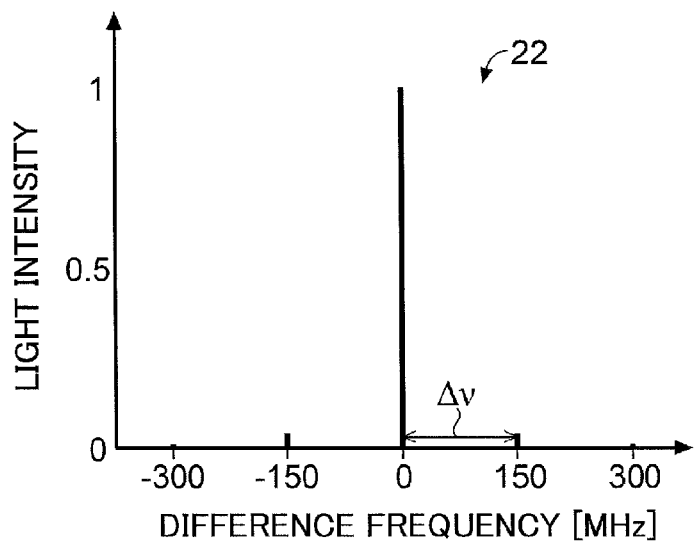
FIG. 39 is a chart illustrating yet another example of laser light input as a fundamental wave in the wavelength converter in the first embodiment.
Figure 40:
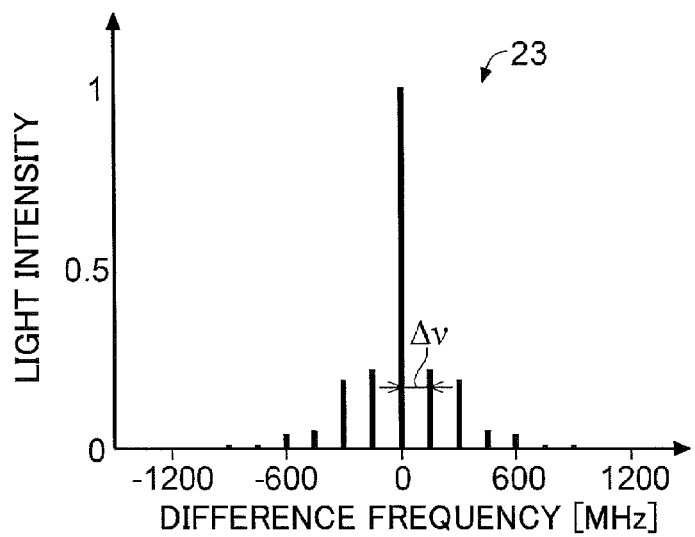
FIG. 40 is a chart illustrating the fourth harmonic light of the laser light in FIG. 39 as a fundamental wave entering the BBO and KBBF crystals.

FIG. 36 illustrates the fourth harmonic light (laser light 23) generated by using the BBO crystal 302 and the KBBF crystal 307 with the laser light 22 in FIG. 35 serving as a fundamental wave. FIG. 38 illustrates the fourth harmonic light (laser light 23) generated by using the BBO crystal 302 and the KBBF crystal 307 with the laser light 22 in FIG. 37 serving as a fundamental wave. FIG. 40 illustrates the fourth harmonic light (laser light 23) generated by using the BBO crystal 302 and the KBBF crystal 307 with laser light 22 in FIG. 39 serving as a fundamental wave. In FIGS. 35, 37, and 39, the longitudinal mode spacing $\Delta v$ of the laser light 22, which is a fundamental wave, may be 150 MHz. The number of longitudinal modes may be five. In FIGS. 35 to 40, the horizontal axis represents the difference frequency between the center frequency and each spectrum and the vertical axis represents the light intensity of each spectrum. In FIGS. 35 to 40, the spectral intensity is normalized so as to set the maximum value to 1.

3.1.4 Detector

The detector 420 included in the solid-state laser apparatus 10 illustrated in FIG. 3 will be described. While the master oscillator 100 is used in the following examples, any of the other aforementioned master oscillators is also applicable.

The laser light 23 output from the wavelength converter 300 may be split by the beam splitter 410 as described above with reference to FIG. 3. The laser light 23 having passed through the beam splitter 410 may be output as the laser light 20 out of the solid-state laser apparatus 10. The laser light 24 having been reflected by the beam splitter 410 may enter the detector 420. The detector 420 may detect the spectral linewidth of the incident laser light 24. A couple of examples of the detector 420 illustrated in FIG. 3 will be described in detail with reference to some drawings.

3.1.4.1 Detector Using Monitor Etalon

Figure 41:
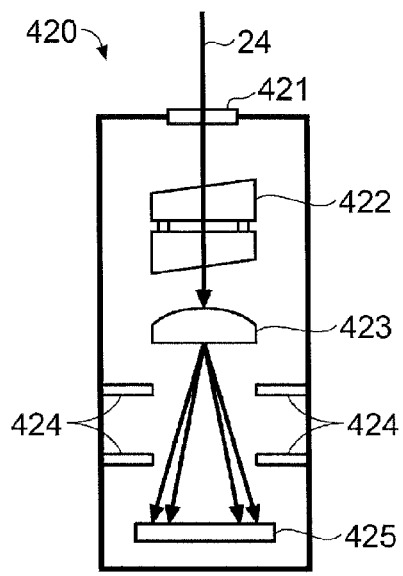
FIG. 41 is a schematic view illustrating an example of the configuration of a detector in the first embodiment.

The detector 420 using a monitor etalon will be described in detail with reference to a drawing. FIG. 41 schematically illustrates the configuration of this detector 420. The detector 420 may include a diffuser 421, a monitor etalon 422, a condenser lens 423, and an image sensor 425 (or photodiode array) as illustrated in FIG. 41.

The laser light 24 having been split by the beam splitter 410 may be incident on the diffuser 421. The diffuser 421 may diffuse the incident laser light 24. The resulting diffused light may be incident on the monitor etalon 422. The monitor etalon 422 may be an air-gap etalon prepared by arranging two mirrors with a spacer interposed therebetween to maintain a certain spacing, each of the mirrors including a substrate that transmits the laser light 24 and whose surface is coated with a partially reflective film. The monitor etalon 422 may transmit light of certain wavelengths among the incident diffused light. The transmitted light may be then incident on the condenser lens 423. The image sensor 425 may be arranged on the focal plane of the condenser lens 423. The transmitted light having been condensed by the condenser lens 423 can create interference fringes on the image sensor 425. The image sensor 425 may detect such interference fringes. The second power of the radius of an interference fringe can be proportional to the wavelength of the laser light 24. The total spectrum of the laser light 24 can be, therefore, detected from the detected interference fringes. The spectral linewidth can be determined by an information processer (not illustrated) based on the detected spectrum or calculated by the controller 430.

Between the condenser lens 423 and the image sensor 425, dousers 424 may be provided for reducing stray light. Interference fringes can be thus detected with higher accuracy.

3.1.4.2 Detector Using Czerny-Turner Spectroscope

Figure 42:
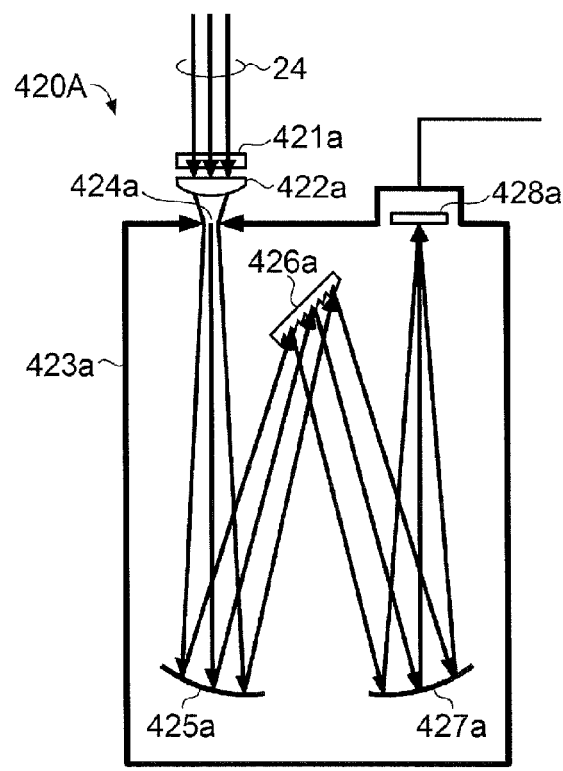
FIG. 42 is a schematic view illustrating another example of the configuration of the detector in the first embodiment.

A detector 420A using a Czerny-Turner spectroscope will be described in detail with reference to a drawing. FIG. 42 schematically illustrates the configuration of the detector 420A. The detector 420A may include a diffuser 421a, a condenser lens 422a, and a spectroscope 423a as illustrated in FIG. 42. The spectroscope 423a may include a concave mirror 425a, a grating 426a, a concave mirror 427a, and an image sensor (line sensor) 428a.

The laser light 24 having been split by the beam splitter 410 may be incident on the diffuser 421a. The diffuser 421a may diffuse the incident laser light 24. The resulting diffused light may be incident on the condenser lens 422a. Around the focal plane of the condenser lens 422a, an inlet slit 424a of the spectroscope 423a may be situated. The inlet slit 424a may be located slightly upstream of the focal plane of the condenser lens 422a. The diffused light having been condensed by the condenser lens 422a may be incident on the concave mirror 425a through the inlet slit 424a. The concave mirror 425a may reflect the incident diffused light so as to convert the light into collimated light. The reflected light may be then incident on the grating 426a. The grating 426a may diffract the incident collimated light. The diffracted light may be then incident on the concave mirror 427a. The concave mirror 427a may reflect the incident diffracted light so as to condense the light. On the focal plane of the concave mirror 427a, the image sensor 428a may be situated. In this case, the reflected light condensed by the concave mirror 427a can form an image on the image sensor 428a. The image sensor 428a may detect the intensity distribution of light at individual imaging positions (channels). The imaging positions of the reflected light can be proportional to the wavelength of the laser light 24. The total spectrum of the laser light 24 can be, therefore, detected from the detected imaging positions. The spectral linewidth can be determined by an information processer (not illustrated) based on the detected spectrum or calculated by the controller 430.

The total spectral linewidth of the laser light 24 may be determined as the linewidth of a curve connecting the light intensity peaks of the longitudinal modes, the curve being determined by fitting, for example. Alternatively, the total spectral linewidth of the laser light 24 may be determined as the linewidth of a blurred spectrum detected by a comparatively low resolution detector 420. The detector 420 may input the detected spectral linewidth into the controller 430.

While the laser light 23 output from the wavelength converter 300, i.e., an output of the solid-state laser apparatus 10 is sampled and the spectral linewidth of the light is detected by the detector 420 in the first embodiment, this is not a limiting example. For example, the laser light 21 output from the master oscillator 100 or the laser light 22 output from the amplifier 200 may be sampled and the spectral linewidth of the light may be detected by the detector 420.

3.1.5 Controller

The controller 430 included in the solid-state laser apparatus 10 illustrated in FIG. 3 will be described. While the master oscillator 100 is used in the following example, any of the other aforementioned master oscillators is also applicable.

The controller 430 may feedback-control the master oscillator 100 based on the spectral linewidth detected by the detector 420 as described earlier. Specifically, the controller 430 may transmit a control signal to the driver 101b of the master oscillator 100 in such a manner that the spectral linewidth detected by the detector 420 will be a desired spectral linewidth. In this process, the controller 430 may control the center frequency, the longitudinal mode spacing, and the light intensity of each of the longitudinal modes L1 to Ln of the laser light 21 output from the master oscillator 100.

Figure 43:
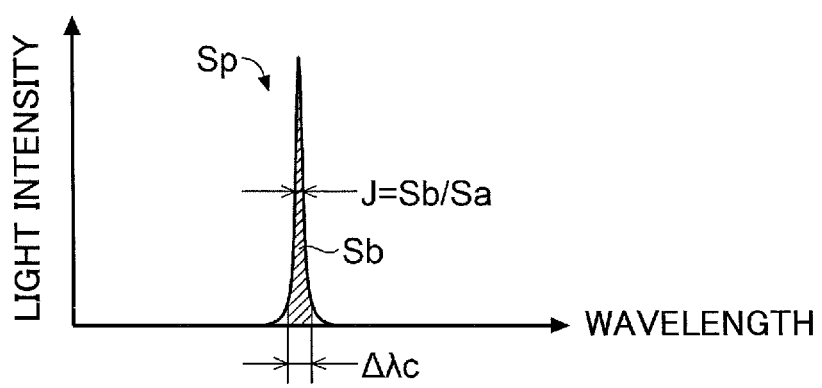
FIG. 43 is a chart illustrating spectral purity E95.

Referring next to FIG. 43, the spectral purity E95 will be described. Supposing that the total optical energy of the spectrum Sp is Sa and the optical energy included in the linewidth $\Delta\lambda c$ is Sb as illustrated in FIG. 43, the spectral purity E95 can be defined as a linewidth $\Delta\lambda c$ with which spectral purity J represented by Formula (7) below is 95%.

$$J = Sb/Sa \quad (7)$$

The spectral purity E95 can be an index that has an influence on the resolving power of lenses in an exposure apparatus, for example. The spectral purity E95 required by an exposure apparatus may be input into the controller 430 from an external apparatus 50, such as an exposure apparatus controller and a higher-level controller of the laser system 1. The controller 430 may calculate the spectral purity E95 based on the spectrum detected by the detector 420 and compare the spectral purity thus calculated and the required spectral purity E95. Furthermore, the controller 430 may feedback-control the master oscillator 100 based on the comparison result in such a manner that the spectral purity of the pulsed laser light 21 will be the required spectral purity E95.

3.2 Amplifying Apparatus

The amplifying apparatus 80 illustrated in FIG. 2 will be described in greater detail with reference to a drawing. The amplifying apparatus 80 may be various types of amplifying apparatuses including power oscillators, power amplifiers, and regenerative amplifiers. The amplifying apparatus 80 may be a single amplifying apparatus or include a plurality of amplifying apparatuses. While the solid-state laser apparatus 10 illustrated in FIG. 3 is used in the following example, other solid-state laser apparatuses are also applicable.

3.2.1 Power Oscillator

Figure 44:
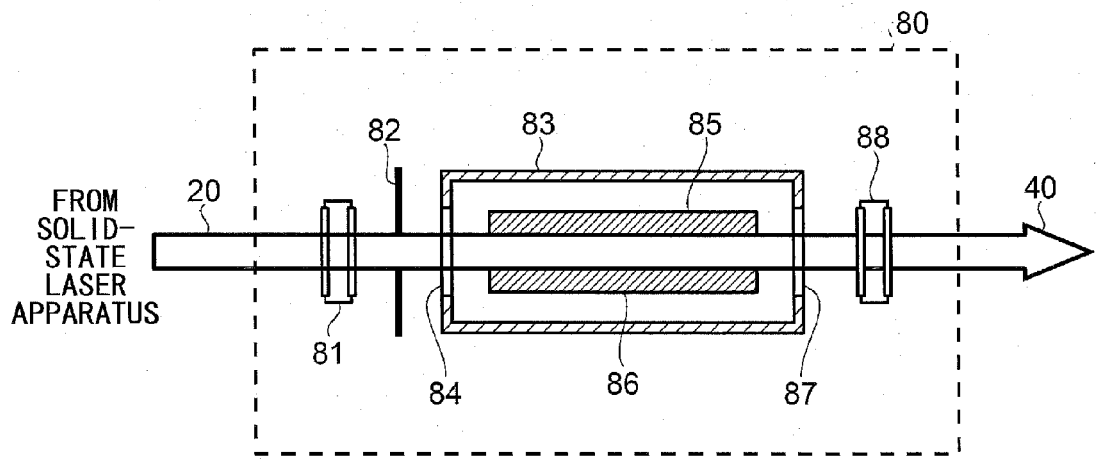
FIG. 44 is a schematic view illustrating the configuration of an amplifying apparatus structured as a power oscillator in the first embodiment.

FIG. 44 schematically illustrates the configuration of the amplifying apparatus 80 structured as a power oscillator. This amplifying apparatus 80 may include a rear mirror 81, a chamber 83, and an output coupler 88 as illustrated in FIG. 44. The rear mirror 81 may serve as one end mirror of an optical resonator. The chamber 83 may include an amplifying space for amplifying the laser light 20 reciprocating in the optical resonator. The output coupler 88 may serve as the other end mirror of the optical resonator. The output coupler 88 may be an end for outputting the laser light 40. The amplifying apparatus 80 may also have a slit 82 for adjusting the beam profile of the laser light 20 reciprocating in the optical resonator. The chamber 83 may be provided with windows 84 and 87. The windows 84 and 87 may optically expose the inside of the chamber 83 to the laser light 20, while maintaining air tightness in the chamber 83. The chamber 83 may contain a gaseous gain medium sealed therein. The gain medium may include at least one of Kr gas, Ar gas, $F_2$ gas, Ne gas, and Xe gas, for example. Furthermore, the chamber 83 may be provided with a pair of discharge electrodes 85 and 86. The discharge electrodes 85 and 86 may be arranged with a space (amplifying space) therebetween through which the laser light 20 passes. Pulsed high voltage may be applied from a power supply (not illustrated) to the discharge electrodes 85 and 86. The high voltage may be applied between the discharge electrodes 85 and 86 in synchronization with the laser light 20 passing through the amplifying space. With the high voltage applied between the discharge electrodes 85 and 86, an amplifying space including the gain medium being activated can be formed. The laser light 20 can be amplified upon passing through this amplifying space. The amplified laser light 20 may then be output as the laser light 40 through the output coupler 88.

In the first embodiment and its modifications, the wavelength of the laser light 21 output from the master oscillator 100 can be converted by the wavelength converter 300 as described above. Accordingly, the laser light 20 having such a spectral linewidth that can suppress chromatic aberration and speckle can be produced. A master oscillator using a solid substance, such as Ti:sapphire crystal and semiconductor material, as a laser oscillation medium may provide better oscillation efficiency than general gas lasers. The first embodiment, therefore, can achieve energy saving. By employing the laser system 1 as the light source for semiconductor exposure, the throughput and resolving power of this exposure apparatus can be improved. Furthermore, the master oscillator using a solid substance, such as Ti:sapphire crystal and semiconductor material, as a laser oscillation medium can typically provide a smaller and simpler structure than gas lasers. Accordingly, the entire structure of the laser system 1 can be downsized and simplified.

In the first embodiment, the spectral linewidth of the laser light 23 whose wavelength has been converted may be detected and the master oscillator 100 may be feedback-controlled based on the detection result. This configuration can detect the spectral linewidth of the laser light 20 whose spectrum is similar to the spectrum of the laser light 40 that is actually used for exposure. As a result, the master oscillator 100 can be feedback-controlled in a more accurate and stable manner.

Laser light for semiconductor exposure may be required to be laser light (ArF laser) with a center wavelength of 193.5 nm. In this case, it is preferable that the resonator length $L_{EXC}$ be set to about 1 m, the spectral purity E95 to 0.3 μm, and the number of longitudinal modes of the laser light to 17 for some cases. An example will be given below in which the laser system 1 in the first embodiment produces laser light having 17 longitudinal modes.

The longitudinal mode spacing $\Delta\omega$ (or $\Delta\nu$) of laser light generated by a general solid-state laser is much larger than the longitudinal mode spacing of laser light generated by a semiconductor laser, for example. For this reason, a desired number of longitudinal modes may be hard to be included in a desired spectral linewidth in some cases.

To address this, the resonator length $L_{sol}$ of the master oscillator 100 is set to 1 m and the number of longitudinal modes of the laser light 21 (fundamental wave) to 5 in the first embodiment, for example. The center wavelength of the laser light 21 is set to 773.6 nm. The wavelength converter 300 using the BBO crystal 302 and the KBBF crystal 307 can generate fourth harmonic light (laser light 23) with 17 longitudinal modes from the laser light 22 after being amplified by the amplifier 200, for example. The center wavelength of the laser light 23 can be 193.4 nm. Specifically, the BBO crystal 302 in the wavelength converter 300 can generate second harmonic light (laser light 23a) with a center wavelength of 386.8 nm and nine longitudinal modes from the laser light 22 (fundamental wave) with a center wavelength of 773.6 nm and five longitudinal modes. The KBBF crystal 307 can generate fourth harmonic light (laser light 23) with a center wavelength of 193.8 nm and 17 longitudinal modes from the second harmonic light (laser light 23a) with a center wavelength of 386.8 nm and nine longitudinal modes. The use of such laser light 23 with 17 longitudinal modes can suppress chromatic aberration and speckle.

4. Laser System Feedback-Controlling Total Spectral Linewidth

Second Embodiment

Figure 45:
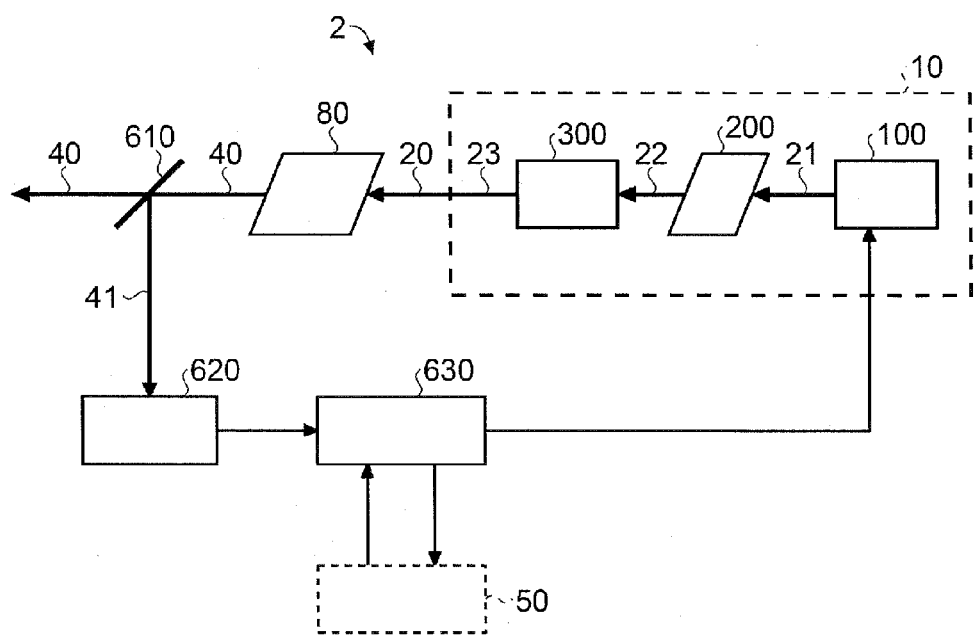
FIG. 45 is a schematic view illustrating the configuration of a laser system in a second embodiment of the present disclosure.

A laser system 2 in a second embodiment of the present disclosure will be described in detail with reference to FIG. 45. FIG. 45 schematically illustrates the configuration of the laser system 2 in the second embodiment. The laser system 2 may include, like the laser system 1 illustrated in FIG. 1, the solid-state laser apparatus 10 and the amplifying apparatus 80 as illustrated in FIG. 45. The laser system 2 may also include a beam splitter 610, a detector 620, and a controller 630. The beam splitter 610 may be arranged on the optical path of the laser light 40 output from the amplifying apparatus 80. The beam splitter 610 may split the optical path of the laser light 40 into two. The laser light 40 having passed through the beam splitter 610 may be output to an exposure apparatus, for example. The laser light 40 having been reflected by the beam splitter 610 may enter the detector 620 as laser light 41.

The detector 620 may function in the same manner as the detector 420 in the first embodiment. The detector 620 may detect the total spectral linewidth of the laser light 41. The controller 630 may feedback-control the master oscillator 100 in the solid-state laser apparatus 10 based on the detected spectral linewidth. In this case, the controller 630 may control the center frequency, the longitudinal mode spacing, and the light intensity of each of the longitudinal modes L1 to Ln of the laser light 21 output from the master oscillator 100. The controller 630 may also feedback-control the master oscillator 100 in accordance with a command from an external apparatus 50, such as an exposure apparatus controller.

The controller 630 may receive the spectral purity E95 required by the exposure apparatus from an external apparatus 50, such as an exposure apparatus controller and a higher-level controller of the laser system 2. The controller 630 may calculate the spectral purity E95 based on the spectrum detected by the detector 620 and compare the spectral purity thus calculated and the required spectral purity E95. Furthermore, the controller 630 may feedback-control the master oscillator 100 based on the comparison result in such a manner that the spectral purity of the laser light 21 will be the required spectral purity E95.

In the second embodiment, the master oscillator 100 can be feedback-controlled based on the spectral linewidth of the laser light 40 to be actually used for exposure. As a result, the laser light 40 that can satisfy an external requirement, etc., in a more reliable manner can be produced. The other configurations, operations, and effects are the same as or similar to those of the first embodiment or its modifications, and further description is omitted here.

5. Modifications of Solid-State Laser Apparatus

Other modes of the solid-state laser apparatus 10 will be described in detail with reference to some drawings.

Figure 46:
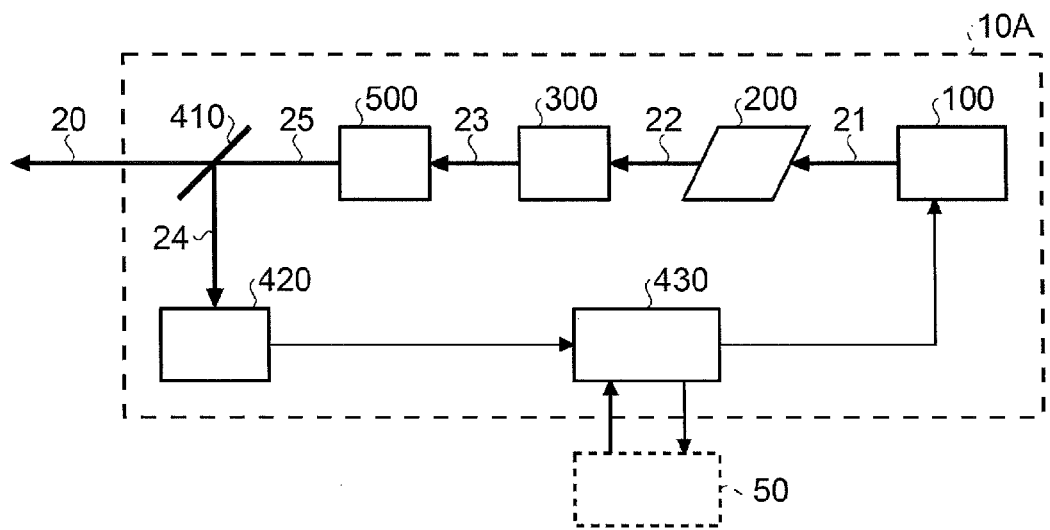
FIG. 46 is a schematic view illustrating the configuration of a solid-state laser apparatus in a first modification.

5.1 Solid-State Laser Apparatus Including Coherence Reduction Module: First Modification A first modification of the solid-state laser apparatus 10 will be described in detail with reference to a drawing. FIG. 46 schematically illustrates the configuration of a solid-state laser apparatus 10A that is the first modification of the solid-state laser apparatus 10.

The solid-state laser apparatus 10A may include a coherence reduction module 500 as illustrated in FIG. 46, in addition to the configuration that is the same as or similar to that of the solid-state laser apparatus 10 in FIG. 3. The coherence reduction module 500 may be located downstream of the wavelength converter 300. The coherence reduction module 500 may reduce the coherence of the incident laser light 23. Accordingly, laser light 25 that hardly causes speckle can be produced.

5.1.1 Coherence Reduction Module Using Optical Pulse Stretch

Figure 47:
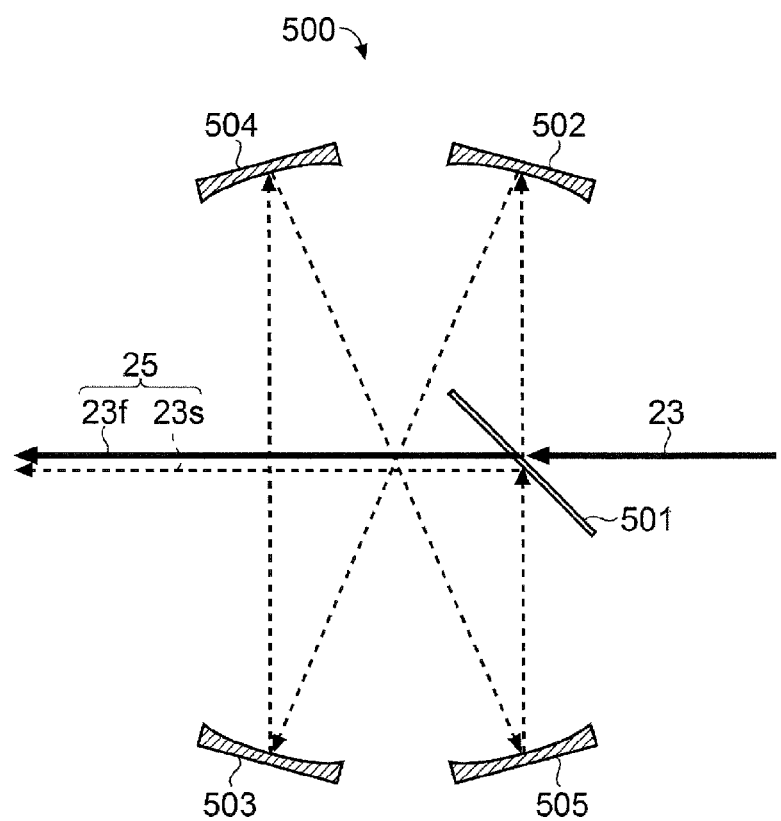
FIG. 47 is a schematic view illustrating the configuration of the coherence reduction module in FIG. 46.

The coherence reduction module 500 using an optical pulse stretch will be described in detail with reference to a drawing. FIG. 47 schematically illustrates the configuration of the coherence reduction module 500 in FIG. 46.

The coherence reduction module 500 may include a beam splitter 501 and highly reflective concave mirrors 502 to 505 as illustrated in FIG. 47. The beam splitter 501 may reflect part of the laser light 23 and transmit another part of the laser light. The highly reflective concave mirrors 502 to 505 may constitute an optical path in which an optical image of the laser light 23 reflected by the beam splitter 501 is transferred and formed again on the beam splitter 501. The optical path of laser light 23s incident on the beam splitter 501 can be aligned with the optical path of laser light 23f having passed through the beam splitter 501. As a result, part of the incident laser light 23 can be delayed, whereby the coherence of the laser light 25 including the laser light 23s and the laser light 23f can be reduced.

As described above, by including the coherence reduction module 500 in the solid-state laser apparatus 10A, the laser light 20 whose coherence is reduced can be output. Potential speckle occurring during semiconductor exposure can be thus suppressed. The coherence reduction module 500 may alternatively be implemented by use of other optical elements in place of the optical pulse stretch. The coherence of laser light can be reduced by using a random phase plate, for example.

The coherence reduction module 500 may be located upstream of the wavelength converter 300. In this case, the coherence of laser light can be reduced at a stage in which the energy loss of the wavelength due to reflection remains relatively low. It should be noted that the layout order of the wavelength converter 300 and the coherence reduction module 500 is not limited to the order described above.

An example will now be given in which the coherence reduction module 500 is arranged on the optical path between the amplifier 200 and the wavelength converter 300. For example, supposing that the wavelength of the laser light 21 output from the master oscillator 100 is $\lambda_{solid\_mo}$, the spectral linewidth of the laser light 21 is $\Delta\lambda_{solid\_mo}$, the optical path length of the optical resonator constituted by the highly reflective mirror 202 and the output coupler 204 in the amplifier 200 is $L_{reso}$, and the optical path length of the coherence reduction module 500 is $L_{ops}$, the coherence length $L_{coh}$ of the laser light 25 whose coherence has been reduced may satisfy Formula (8) below.

$$L_{coh} = \frac{(\lambda_{solid\_mo})^2}{\Delta\lambda_{solid\_mo}} \tag{8}$$

$$L_{coh} < L_{ops}$$

Figure 48:
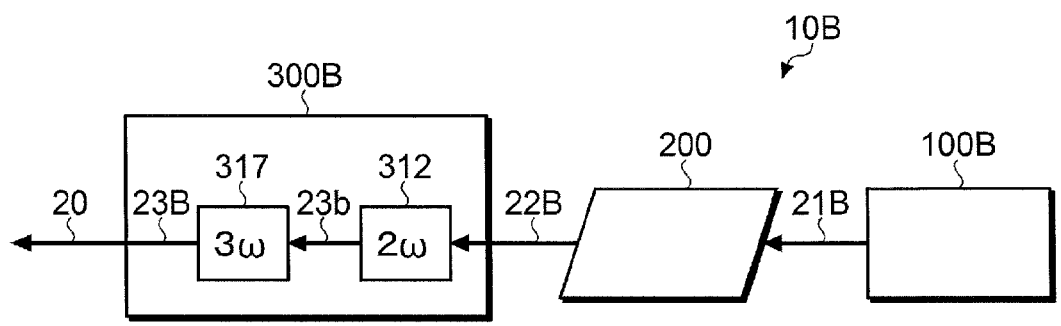
FIG. 48 is a schematic view illustrating the configuration of a solid-state laser apparatus in a second modification.

5.2 Solid-State Laser Apparatus Including Wavelength Converter Using LBO Crystal and THG Crystal: Second Modification A second modification of the solid-state laser apparatus 10 will be described in detail with reference to a drawing. FIG. 48 schematically illustrates the configuration of a solid-state laser apparatus 10B that is the second modification of the solid-state laser apparatus 10.

The solid-state laser apparatus 10B may include a master oscillator 100B and a wavelength converter 300B as illustrated in FIG. 48, in place of the master oscillator 100 and the wavelength converter 300 in FIG. 3. The other configurations may be the same as or similar to those in FIG. 3.

The master oscillator 100B may be a solid-state laser including a Ti:sapphire laser crystal or a semiconductor laser. The master oscillator 100B may output multi-longitudinal mode laser light (fundamental wave) with a wavelength of 745.3 nm, for example. Various types of mechanisms are applicable as the mechanism for producing the multi-longitudinal mode laser light.

The wavelength converter 300B may include a lithium triborate (LBO) crystal 312 and a third harmonic generation (THG) crystal 317. The master oscillator 100B may output laser light 21B with a center wavelength of 745.3 nm. The amplifier 200 may amplify the laser light 21B and output laser light 22B thus amplified. The LBO crystal 312 may generate, as laser light 23b, the second harmonic light (with a wavelength of 496.8 nm) of the amplified laser light 22B (with a wavelength of 745.3 nm). The THG crystal 317 may be a nonlinear optical crystal capable of generating third harmonic light. The THG crystal 317 may generate third harmonic light (with a wavelength of 248.4 nm) as laser light 23B from the laser light 23b serving as a fundamental wave. The laser light 23B may be output as the laser light 20 out of the solid-state laser apparatus 10B.

As described above, by using various types of nonlinear optical crystals in the wavelength converter as appropriate, multi-longitudinal mode laser light applicable to KrF and other lasers as well as ArF lasers can be produced. Various types of nonlinear optical crystals including $CsLiB_6O_{10}$ (CLBO) and other crystal types can be used as the nonlinear optical crystals, besides BBO, LBO, and KBBF crystals mentioned above.

6. Laser System using Power Amplifier as Amplifying Apparatus

Third Embodiment

Figure 49:
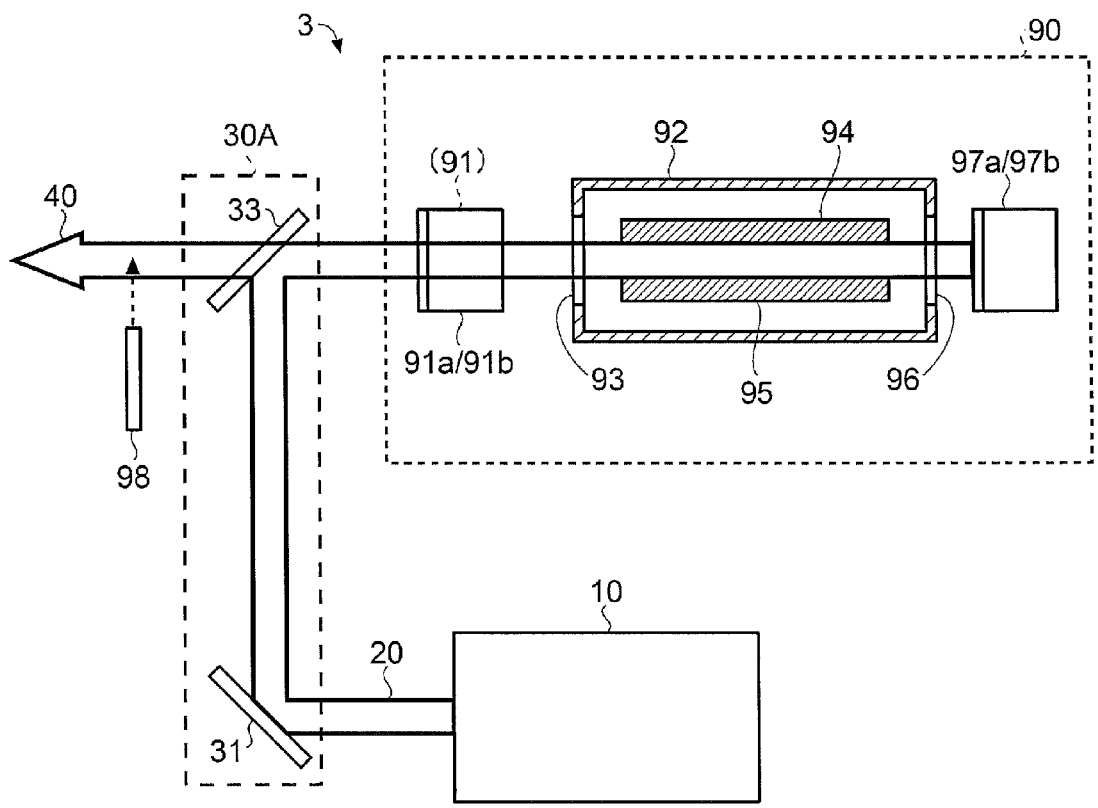
FIG. 49 is a schematic view illustrating the configuration of a laser system in a third embodiment of the present disclosure.
Figure 50:
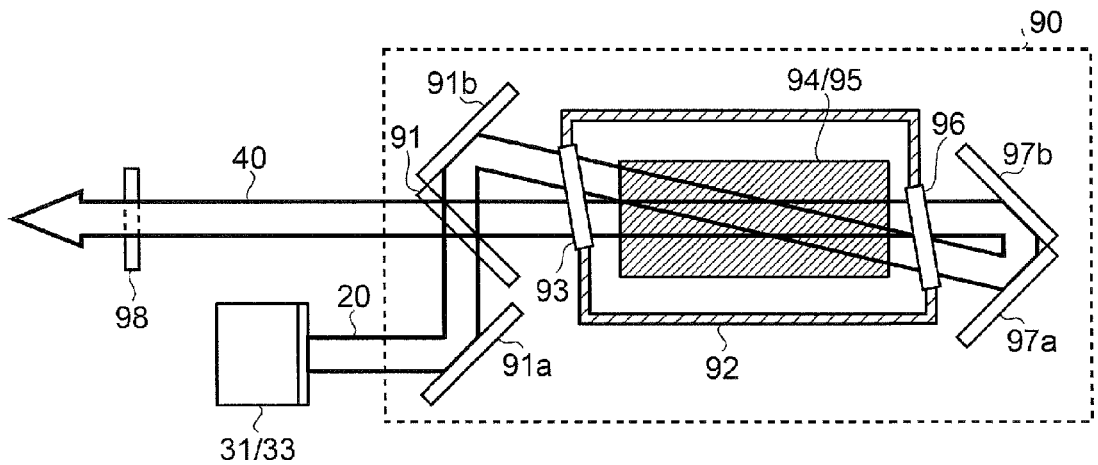
FIG. 50 is a schematic view illustrating a different cross section along the optical path of the amplifying apparatus in FIG. 49.

A laser system 3 in a third embodiment of the present disclosure will be described in detail with reference to drawings. FIG. 49 schematically illustrates the configuration of the laser system 3 in the third embodiment. FIG. 50 schematically illustrates a different cross section along the optical path of an amplifying apparatus 90 in FIG. 49.

The third embodiment may employ the amplifying apparatus 90 that is a power amplifier as illustrated in FIG. 49, in place of the amplifying apparatus 80, which is a power oscillator, in FIG. 2. The laser system 3 may also include a shutter 98 for blocking the laser light 40 output from the amplifying apparatus 90.

The amplifying apparatus 90 may include highly reflective mirrors 91a, 91b, 97a, and 97b, an output coupler 91, and a chamber 92 as illustrated in FIGS. 49 and 50. The highly reflective mirrors 91a, 91b, 97a, and 97b and the output coupler 91 may constitute a multipath that passes through the amplifying space in the chamber 92 multiple times. The output coupler 91 may be a partially reflective mirror. The chamber 92 may be arranged on the optical path constituted by the highly reflective mirrors 91a, 91b, 97a, and 97b and the output coupler 91. The amplifying apparatus 90 may have a slit (not illustrated) for adjusting the beam profile of the laser light traveling inside the apparatus. The chamber 92 may contain a gaseous gain medium sealed therein so as to fill the amplifying space. The gain medium may include at least one of Kr gas, Ar gas, $F_2$ gas, Ne gas, and Xe gas, for example.

With this configuration, the laser light 20 output from the solid-state laser apparatus 10 may enter the amplifying apparatus 90 through an optical system 30A including the highly reflective mirror 31 and a beam splitter 33. The incident laser light 20 may be reflected by the highly reflective mirrors 91a and 91b and then enter the chamber 92 through the window 93. The laser light 20 having entered the chamber 92 may be amplified upon passing through the amplifying space between two discharge electrodes 94 and 95 to which voltage is applied. The amplified laser light 20 may be output through the window 96 out of the chamber 92. The output laser light 20 may be reflected by the highly reflective mirrors 97a and 97b so as to enter the chamber 92 again through the window 96. The laser light 20 may then be amplified again upon passing through the amplifying space in the chamber 92. The amplified laser light 20 may be output through the window 93 out of the chamber 92.

Part of the laser light 20 having passed the amplifying space in the chamber 92 twice may then be output as the laser light 40 through the output coupler 91. The remaining part of the laser light, which has been reflected by the output coupler 91, may be further amplified along the optical path constituted by the highly reflective mirrors 91a, 91b, 97a, and 97b and the output coupler 91.

In the third embodiment, the laser light 20 can be amplified through the multipath in the amplifying apparatus 90, whereby the laser light 40 with higher intensity can be produced. Furthermore, the output of the laser light 40 can be blocked with the shutter 98 located at the output stage of the amplifying apparatus 90 in the third embodiment. The shutter 98 may unblock or block the optical path of the laser light 40 under driving control by a control mechanism (not illustrated), for example. The other configurations, operations, and effects are the same as or similar to those of the first or second embodiment or their modifications, and further description is omitted here.

As described above, by converting the wavelength of the laser light output from the master oscillator, the laser light having such a spectral linewidth that can suppress chromatic aberration and speckle can be produced in the embodiments and their modifications described above. A master oscillator using a solid substance as a laser oscillation medium, such as a solid-state or semiconductor laser, can provide better oscillation efficiency than general gas lasers. The master oscillator can also provide a simpler and smaller structure. Accordingly, by applying the master oscillator described above to a MOPO or MOPA, a laser system capable of reducing power consumption and saving energy can be provided.

The description above is not intended to be limiting, but only to provide examples. It is clear for the skilled person that various changes and modifications can be made in the embodiments in the present disclosure without departing from the spirit and scope of the appended claims. For example, it is intended that the present disclosure is interpreted to include combinations, as appropriate, of the embodiments and modifications described above.

The terms used in this specification and the appended claims should be construed as non-limiting. For example, the terms "comprise" and "include" should be construed as "include but not be limited to". The term "have" should be construed as "have but not be limited to". An indefinite article "a/an" used in this specification and the appended claims should be construed as "at least one" or "one or more".

What is claimed is:

1. A solid-state laser apparatus comprising:
a master oscillator configured to output laser light having at least one longitudinal mode, the master oscillator being capable of changing the spectral linewidth of the laser light output therefrom;
at least one amplifier located downstream of the master oscillator on an optical path;
a wavelength converter located downstream of the amplifier on the optical path;
a detector configured to detect a spectrum of the laser light; and
a controller configured to control the spectral linewidth of the laser light output from the master oscillator based on a detection result of the detector.

2. The solid-state laser apparatus according to claim 1, wherein
the master oscillator comprises:
an optical resonator;
a gain medium arranged in the optical resonator;
a line narrowing module arranged in the optical resonator, the line narrowing module being capable of changing the spectral linewidth; and
a driver configured to drive the line narrowing module, and
the controller controls the driver to control the spectral linewidth.

3. The solid-state laser apparatus according to claim 2, wherein the gain medium comprises a Ti:sapphire crystal.

4. The solid-state laser apparatus according to claim 2, wherein the line narrowing module comprises at least one of a birefringent filter, an etalon, and a diffraction grating.

5. The solid-state laser apparatus according to claim 2, wherein
the line narrowing module comprises an etalon having an incident surface and an output surface of the laser light, at least one of the surfaces being coated with a reflective film,
the etalon is arranged to be movable in a direction different from the optical path of the laser light,
the reflectance of the reflective film varies depending on a position on the incident surface or the output surface, and
the controller controls the position of the etalon with respect to the optical path of the laser light through the driver.

6. The solid-state laser apparatus according to claim 1, wherein
the master oscillator comprises:
a seed laser configured to output seed light having at least one longitudinal mode;
an optical modulator located downstream of the seed laser on the optical path; and
a driver configured to drive the optical modulator, and
the controller controls the driver to control the spectral linewidth.

7. The solid-state laser apparatus according to claim 6, wherein the optical modulator comprises an electro-optic element.

8. The solid-state laser apparatus according to claim 6, wherein the optical modulator comprises an optoacoustic element.

9. The solid-state laser apparatus according to claim 1, wherein
the master oscillator comprises:
a plurality of seed lasers each configured to output seed light having at least one longitudinal mode;
an optical path adjuster configured to substantially align the optical paths of the seed light output from the seed lasers; and
a seed laser controller configured to control the seed lasers,
at least one of the seed lasers outputs seed light having a longitudinal mode with a different center wavelength from the center wavelength of the seed light output from the other seed lasers, and
the controller controls the seed laser controller to control the spectral linewidth.

10. The solid-state laser apparatus according to claim 9, wherein the seed laser controller controls output intensities of the seed lasers.

11. The solid-state laser apparatus according to claim 9, wherein the seed laser controller controls oscillation wavelengths of the seed lasers.

12. The solid-state laser apparatus according to claim 9, wherein the seed lasers are semiconductor lasers.

13. The solid-state laser apparatus according to claim 1, wherein the amplifier comprises a Ti:sapphire crystal as a gain medium.

14. The solid-state laser apparatus according to claim 1, wherein the amplifier comprises an optical resonator and a gain medium arranged in the optical resonator.

15. The solid-state laser apparatus according to claim 1, wherein the wavelength converter comprises at least one nonlinear optical crystal that converts the laser light output from the master oscillator into high-order harmonic light of the laser light.

16. The solid-state laser apparatus according to claim 15, wherein the at least one nonlinear optical crystal contains at least one of a beta barium borate (BBO) crystal, a lithium triborate (LBO) crystal, a $CsLiB_6O_{10}$ (CLBO) crystal, and a $KBe_2BO_3F_2$ (KBBF) crystal.

17. A laser system comprising:
   the solid-state laser apparatus as claimed in claim 1; and
   at least one amplifying apparatus located downstream of the solid-state laser apparatus on an optical path.

18. The laser system according to claim 17, wherein the detector is located downstream of the amplifying apparatus on the optical path.

19. The laser system according to claim 17, wherein the amplifying apparatus comprises a gain medium.

20. The laser system according to claim 19, wherein the amplifying apparatus comprises at least one of Kr gas, Ar gas, $F_2$ gas, Ne gas, and Xe gas as the gain medium.

21. The laser system according to claim 17, wherein the amplifying apparatus comprises an optical resonator and a gain medium arranged in the optical resonator.

* * * * *